US012713540B2

(12) United States Patent
Jin et al.

(10) Patent No.: US 12,713,540 B2
(45) Date of Patent: Aug. 18, 2026

(54) DISPLAY DEVICE

(71) Applicant: SAMSUNG ELECTRONICS CO., LTD., Suwon-si (KR)

(72) Inventors: Suhwan Jin, Suwon-si (KR); Jeongryeol Seo, Suwon-si (KR); Jung Hur, Suwon-si (KR); Chanhyuk Boo, Suwon-si (KR); Sungook Ok, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 283 days.

(21) Appl. No.: 18/590,659

(22) Filed: Feb. 28, 2024

(65) Prior Publication Data

US 2024/0206083 A1 Jun. 20, 2024

Related U.S. Application Data

(63) Continuation of application No. PCT/KR2022/013988, filed on Sep. 19, 2022.

(30) Foreign Application Priority Data

Nov. 15, 2021 (KR) ........................ 10-2021-0156349

(51) Int. Cl.
*H05K 5/00* (2025.01)
*H05K 5/30* (2025.01)

(52) U.S. Cl.
CPC ............. *H05K 5/0026* (2013.01); *H05K 5/30* (2025.01)

(58) Field of Classification Search
CPC ...... H05K 5/0026; H05K 5/30; G06F 3/1446; G06F 1/1601; H01R 12/7076;
(Continued)

(56) References Cited

U.S. PATENT DOCUMENTS 6,502,945 B2 * 1/2003 Kim ..................... G02B 6/0071 362/613
6,659,783 B2 12/2003 Copper et al.
(Continued)

FOREIGN PATENT DOCUMENTS

EP 3104465 A1 * 12/2016 ........... G06F 1/1658
JP 3-285524 A 12/1991
(Continued)

OTHER PUBLICATIONS

International Search Report (PCT/ISA/210) dated Dec. 14, 2022, issued by International Searching Authority in International Application No. PCT/KR2022/013988.
(Continued)

*Primary Examiner* — Abdullah A Riyami
*Assistant Examiner* — Nader J Alhawamdeh
(74) *Attorney, Agent, or Firm* — Sughrue Mion, PLLC

(57) ABSTRACT

A display device includes a display module on which a second connector is provided; a chassis assembly configured to support the display module; a printed circuit board provided in the chassis assembly and configured to drive or control the display module; and a first connector electrically connected to the printed circuit board and arranged to match the second connector, the first connector being configured to transmit and receive electric signals to the display module, wherein the first connector may include a first power connector for power and a first switching signal connector for switching signal that have areas facing the second connector, each of the first switching signal connector and the first power connector has a length of an area in a direction in which the display module is coupled to the chassis assembly, the length of the area of the first switching signal connector is less than the length of the area of the first power connector, and in a state in which the display module is coupled to the
(Continued)

chassis assembly, the first power connector contacts the second connector before the first switching signal connector contacts the second connector.

20 Claims, 17 Drawing Sheets

(58) Field of Classification Search
CPC .. H01R 12/714; H01R 13/2421; H01R 12/70; G09F 9/3023
See application file for complete search history.

(56) References Cited

U.S. PATENT DOCUMENTS

| | | | | |
|---|---|---|---|---|
| 6,753,624 | B2 | 6/2004 | Miwa | |
| 8,206,001 | B2 | 6/2012 | Piepgras et al. | |
| 8,277,253 | B2 | 10/2012 | Lee et al. | |
| 8,541,716 | B2 | 9/2013 | Gu et al. | |
| 10,743,426 | B2 * | 8/2020 | Hong | H05K 5/30 |
| 10,853,017 | B2 | 12/2020 | Park et al. | |
| 11,288,028 | B2 | 3/2022 | Miles et al. | |
| 11,404,363 | B2 | 8/2022 | Hotta et al. | |
| 2013/0223068 | A1 | 8/2013 | Choi | |
| 2014/0125352 | A1 | 5/2014 | Franke et al. | |
| 2014/0226084 | A1 | 8/2014 | Utukuri et al. | |
| 2015/0349440 | A1 | 12/2015 | Seok et al. | |
| 2017/0220310 | A1 * | 8/2017 | Hochman | H01R 13/6205 |
| 2020/0327851 | A1 * | 10/2020 | Seo | G06F 3/1446 |
| 2021/0288434 | A1 | 9/2021 | Ramsey et al. | |
| 2022/0115824 | A1 | 4/2022 | Aridah et al. | |
| 2023/0386399 | A1 | 11/2023 | Chang et al. | |
| 2024/0206083 | A1 * | 6/2024 | Jin | H01R 12/714 |

FOREIGN PATENT DOCUMENTS

| | | | |
|---|---|---|---|
| KR | 10-0849481 | B1 | 7/2008 |
| KR | 20-0445165 | Y1 | 7/2009 |
| KR | 10-0922694 | B1 | 10/2009 |
| KR | 10-2010-0008288 | A | 1/2010 |
| KR | 10-2012-0022624 | A | 3/2012 |
| KR | 10-1295119 | B1 | 8/2013 |
| KR | 10-1343562 | B1 | 12/2013 |
| KR | 10-2014-0040816 | A | 4/2014 |
| KR | 10-1417144 | B1 | 8/2014 |
| KR | 10-2015-0136386 | A | 12/2015 |
| KR | 10-2016-0062777 | A | 6/2016 |
| KR | 10-1712620 | B1 | 3/2017 |
| KR | 10-1946954 | B1 | 2/2019 |
| KR | 10-2019-0097285 | A | 8/2019 |
| KR | 10-2019-0103738 | A | 9/2019 |
| KR | 10-2019-0122151 | A | 10/2019 |
| KR | 10-2021-0031123 | A | 3/2021 |
| KR | 10-2021-0067769 | A | 6/2021 |
| WO | 2019/150950 | A1 | 8/2019 |

OTHER PUBLICATIONS

Communication dated on Oct. 29, 2024, issued by European Patent Office in European Patent Application No. 22893009.5.

Communication issued Apr. 28, 2026 by the Korea Ministry of Intellectual Property in Korean Patent Application No. 10-2021-0156349.

* cited by examiner 1
10-n
10-2
10-1
DRIVING BOARD
501
Y
X 10-n
10-2
10-1
POWER BOARD
601
DRIVING BOARD
501
MAIN BOARD
301
Y
X (a)

Q6
DCOUT_PW
Q4
MOSFET
Q5
MOSFET
GND
41b
41a
DCIN_PW
Q3
NPN
GND
41b
Q0
SCREEN_SIGNAL

DISPLAY DEVICE

CROSS-REFERENCE TO RELATED APPLICATIONS

This application is a continuation of International Application No. PCT/KR2022/013988, filed on Sep. 19, 2022, which is based on and claims priority to Korean Patent Application No. 10-2021-0156349, filed on Nov. 15, 2021, in the Korean Intellectual Property Office, the disclosures of which are incorporated by reference herein in their entireties.

BACKGROUND

1. Field

The disclosure relates to a display device that may be capable of preventing arc discharge of a power connector.

2. Description of Related Art

Display devices convert electrical information to visual information and display the visual information for the user. The display devices may include not only televisions or monitors but also portable devices such as notebook personal computers (PCs), smart phones, tablet PCs, etc.

The display device may include an actively light-emitting display panel such as organic light emitting diodes (OLEDs) or a passive light display panel such as liquid crystal displays (LCDs).

The display device that uses the passive light display panel may include a backlight unit for providing light to the display panel. The backlight unit may include an edge-type in which light sources are arranged on at least one side of the display panel and a direct-type in which light sources are arranged behind the display panel.

The display device may include various circuit boards to operate the display device. The circuit boards may be connected to one another to exchange data, signals or power. The circuit boards may be interconnected by electric wires, flexible flat cables (FFCs) or a flexible printed circuit board (FPCB).

A display module including the display panel has a connector arranged therein to transmit or receive electric signals, and a connection structure of the connector uses a cable, for example. However, the traditional connector structure that uses the cable involves a procedure for separately connecting and disconnecting the cable in manufacturing and maintaining the display device, thereby having a low work efficiency and assembly performance.

In a case of a connector having a contact-type connection structure, there may be a movement between a receptacle (or a first connector) and a socket (or a second connector) and the movement may cause arc discharge.

SUMMARY

Provided is a display device that may be capable of preventing arc discharge of a contact-type connector used for power connection.

According to an aspect of the disclosure, a display device includes: a display module on which a second connector is provided; a chassis assembly configured to support the display module; a printed circuit board provided in the chassis assembly and configured to drive or control the display module; and a first connector electrically connected to the printed circuit board and arranged to match the second connector, the first connector being configured to transmit and receive electric signals to the display module, wherein the first connector may include a first power connector for power and a first switching signal connector for switching signal that have areas facing the second connector, each of the first switching signal connector and the first power connector has a length of an area in a direction in which the display module is coupled to the chassis assembly, the length of the area of the first switching signal connector is less than the length of the area of the first power connector, and in a state in which the display module is coupled to the chassis assembly, the first power connector contacts the second connector before the first switching signal connector contacts the second connector.

One of the first connector and the second connector may be a female connector and the other one of the first connector and the second connector may be a male connector.

The first power connector may have a length in a direction facing the second connector that is greater than a length in the direction facing the second connector of the first switching signal connector.

In a state in which the second connector is provided to face a rear direction of the display module, the areas of the first power connector and the first switching signal connector may be determined according to a limit movement amount in a side direction of the display module.

In a state in which the second connector is arranged to face a side direction of the display module, a length of the first switching signal connector in a coupling direction of the display module may be less than a length of the first power connector in the coupling direction of the display module.

The second connector may include an elastic conductor configured to be compressed in a state in which the second connector contacts the first connector.

The second connector may include a second power connector for power arranged to match the first power connector and a second switching signal connector for switching signal arranged to match the first switching signal connector.

Each of the second power connector and the second switching signal connector has a length in a direction of compression, and the length in the direction of compression of the second power connector may be greater than the length in the direction of compression of the second switching signal connector.

The second power connector may be spaced apart from the second switching signal connector by a preset distance in a coupling direction of the display module, and in a state in which the display module is coupled to the chassis assembly, the second power connector contacts the first power connector before the second switching signal connector contacts the first switching signal connector.

The display module further may include a circuit configured to output power, which is input from the first power connector, to the display module in in a state in which the second connector contacts the first switching signal connector.

The circuit further may include a delayer configured to delay a signal input from the first switching signal connector, and the circuit may be configured to output power, which is input from the first power connector, to the display module based on input of a signal delayed by the delayer.

The second connector may include: an electrode contacting the first connector; a conductive elastic member electrically connected to the electrode; a guide configured to guide a compression direction of the electrode; and a housing enclosing and supporting the guide.

According to an aspect of the disclosure, a display device includes: a plurality of display modules integrally forming a screen; and a chassis assembly supporting the plurality of display modules, wherein each of the plurality of display modules may include a main body and a second connector arranged in the main body, the chassis assembly may include: a printed circuit board configured to drive or control the plurality of display modules; and a first connector electrically connected to the printed circuit board and arranged to match the second connector, the first connector being configured to transmit and receive electric signals to the plurality of display modules, the first connector may include a first power connector for power and a first switching signal connector for switching signal that are arranged to have areas facing the second connector, and each of the first switching signal connector and the first power connector has a length of an area of a direction in which the plurality of display modules are coupled to the chassis assembly, and the length of the area of the first switching signal connector is less than the length of the area of the first power connector, and in a state in which the plurality of display modules are coupled to the chassis assembly, the first power connector contacts the second connector before the first switching signal connector contacts the second connector.

The first power connector has a length in a direction facing the second connector that may be greater than a length in the direction facing the second connector of the first switching signal connector.

In a state in which the second connector is provided to face a rear direction of the plurality of display modules, the areas of the first power connector and the first switching signal connector may be determined according to a limit movement amount in a side direction of the plurality of display modules.

In a state in which the second connector is provided to face a side direction of the plurality of display modules, a length of the first switching signal connector in a coupling direction of the plurality of display modules may be less than a length of the first power connector in the coupling direction of the plurality of display modules.

The second connector may include an elastic conductor configured to be compressed in a state in which the second connector contacts the first connector.

The second connector may include a second power connector for power arranged to match the first power connector and a second switching signal connector for switching signal arranged to match the first switching signal connector.

Each of the second power connector and the second switching signal connector has a length in a direction of compression and the length in the direction of compression of the second power connector may be greater than the length in the direction of compression of the second switching signal connector.

The second power connector may be spaced apart from the second switching signal connector by a preset distance in a coupling direction of the plurality of display modules, and in a state in which the plurality of display modules are coupled to the chassis assembly, the second power connector contacts the first power connector before the second switching signal connector contacts the first switching signal connector.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 17 illustrates a configuration of a switching circuit of a display device, according to one or more embodiments.

DETAILED DESCRIPTION

Figure 1:
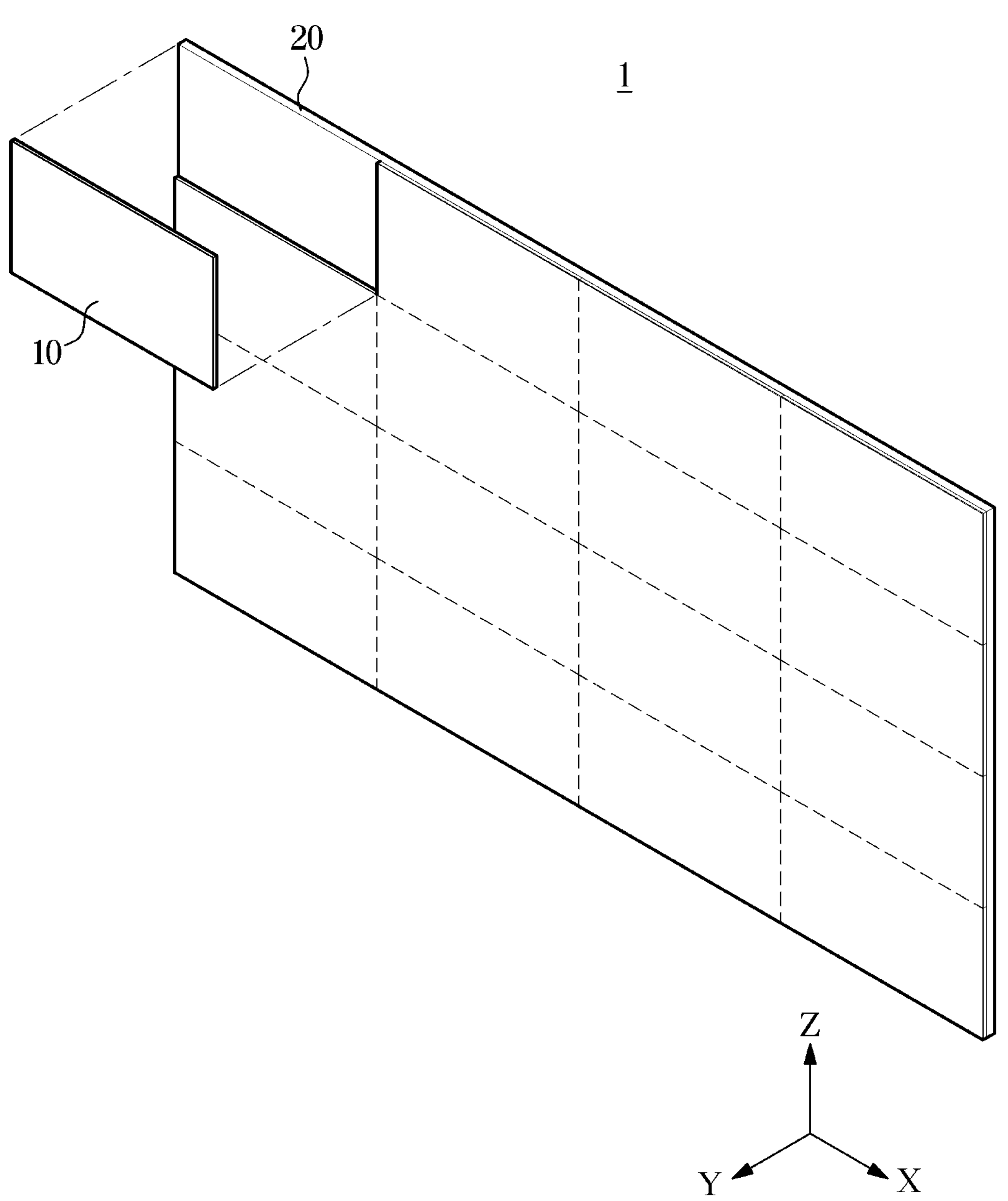
FIG. 1 is a perspective view illustrating display modules and a display device including the display modules, according to one or more embodiments.

Hereinafter, embodiments will be described in detail with reference to the accompanying drawings. When describing the embodiments with reference to the accompanying drawings, like reference numerals refer to like elements and a repeated description related thereto will be omitted.

It should be appreciated that the embodiments described herein are example embodiments, and thus, the disclosure is not limited thereto and embodiments may include various modifications, equivalents, and/or alternatives. It will be further understood that the term "connect" or its derivatives refer both to direct and indirect connection, and the indirect connection includes a connection over a wireless communication network.

The terminology used herein is for the purpose of describing one or more embodiments and is not intended to limit the disclosure. It is to be understood that the singular forms "a,"

"an," and "the" include plural references unless the context clearly dictates otherwise. It will be further understood that the terms "comprise" and "comprising," when used in this specification, specify the presence of stated features, integers, steps, operations, elements, and components, but do not preclude the presence or addition of one or more other features, integers, steps, operations, elements, components, and groups thereof.

The terms including ordinal numbers like "first" and "second" may be used to explain various components, but the components are not limited by the terms. The terms are only for the purpose of distinguishing a component from another. Thus, a first component discussed below could be termed a second component and vice versa, without departing from the teachings of the disclosure.

Furthermore, the terms, such as "part", "block", "member", "module", etc., may refer to a unit of handling at least one function or operation. For example, the terms may refer to at least one process handled by hardware such as field-programmable gate array (FPGA)/application specific integrated circuit (ASIC), etc., software stored in a memory, or at least one processor.

Reference numerals used for method steps are just used to identify the respective steps, but not to limit an order of the steps. Thus, unless the context clearly dictates otherwise, the written order may also be practiced otherwise.

A display module including the display panel has a connector arranged therein to transmit or receive electric signals, and a connection structure of the connector uses a cable. However, the traditional connector structure that uses the cable involves a procedure for separately connecting and disconnecting the cable in manufacturing and maintaining the display device, thereby having a low work efficiency and assembly performance.

A display device according to one or more embodiments of the disclosure may provide a physical contact-type connector to solve the problem.

Reference will now be made in detail to embodiments of the disclosure, which are illustrated in the accompanying drawings.

FIG. 1 is a perspective view illustrating a display device 1 including display modules 10, according to one or more embodiments.

The display device 1 according to one or more embodiments is a self-luminous display device having pixels each having a light emitting device arranged therein to emit light for itself. Hence, unlike a liquid crystal display device, the display device dispenses with such components as a backlight unit, a liquid crystal layer, etc., thereby implementing thinness, having a simple structure, and allowing various changes in design.

Furthermore, the display device 1 according to an embodiment may employ an inorganic light emitting device such as an inorganic light emitting diode (LED) for the light emitting device arranged in each pixel. The inorganic light emitting device has quick response speed as compared with an organic light emitting device such as an organic LED and may implement high brightness at low electric power.

Furthermore, unlike the organic light emitting device that is vulnerable to exposure to water and oxygen, requires an encapsulation process and has weak durability, the inorganic light emitting device has strong durability without a need for the encapsulation process. Hereinafter, the inorganic light emitting device, as will be mentioned in the following embodiment, refers to the inorganic LED.

The inorganic light emitting device employed in the display device 1 according to one or more embodiments may be a micro LED, a short side of which has a size of about 100 μm. By employing the micro-sized LEDs, pixel size may be reduced and high resolution may be implemented within the same size screen.

Furthermore, when an LED chip is manufactured to have a micro size, a problem of an inorganic material breaking by nature when bent may be solved. Specifically, when the micro LED chip is transferred onto a flexible substrate, the LED chip does not break even when the substrate is bent, making it possible to implement a flexible display device.

The display device employing the micro LED may be applied in various fields by using the subminiature pixel size and great thinness. For example, as shown in FIG. 1, a large-area screen may be implemented by tiling and fixing the plurality of display modules 10, onto which a plurality of micro LEDs are transferred, to a chassis assembly 20, and the large-area screen display device may be used as a signage, a billboard, etc.

In the meantime, a three-dimensional (3D) coordinate system of XYZ-axes shown in FIG. 1 is based on the display device 1, in which case the screen of the display device 1 is located in the plane XZ and a direction in which the image is output or in which light is emitted from the inorganic light emitting device is direction +Y. As the coordinate system is based on the display device 1, the same coordinate system may be applied to an occasion when the display device 1 lies on a side and an occasion when the display device 1 stands up.

The display device 1 is normally used in a standing position and the user watches the image in front of the display device 1, so the direction +Y in which the image is output may be called a forward direction and the opposite direction −Y a rearward direction.

Furthermore, the display device 1 may be usually produced (manufactured) by combining the display module 10 and a chassis assembly 20. Accordingly, it is also possible to call the direction −Y of the display device 1 a coupling direction and the direction +Y a decoupling direction. For example, in the following embodiments, the direction +Y may be called the decoupling direction or the forward direction and the direction −Y may be called the downward direction or the rearward direction.

Four surfaces other than the upper and lower surfaces of the display device 1 or the display module 10 of a flat form will be herein called side surfaces regardless of the posture of the display device 1 or the display module 10.

Although the display device 1 is shown as including a plurality of display modules to implement a large-area screen in the example of FIG. 1, embodiments of the display device 1 are not limited thereto. It is also possible for the display device 1 to include one display module 10 to be implemented as a television, a wearable device, a portable device, a personal computer (PC) monitor, etc.

The display module 10 may include M×N (M and N are integers equal to or greater than 2) pixels P, i.e., a plurality of pixels P arranged in two dimensions (2D). "Being arranged in 2D" may include not only an occasion of being arranged in the same plane but also an occasion of being arranged in different parallel planes. Furthermore, in the case that the components are arranged in the same plane, tops of the components do not need to be leveled in the same plane but may also be in different parallel planes.

A unit pixel P may include at least three sub-pixels which output different colors of light. For example, the unit pixel P may include three sub-pixels SP (R), SP (G), and SP (B) corresponding to red (R), green (G), and blue (B), respectively. The red sub-pixel SP (R) may output red light, the green sub-pixel SP (G) may output green light, and the blue sub-pixel SP (B) may output blue light.

As described above, according to one or more embodiments, the display module 10 and the display device 1 is the self-luminous display device having pixels each capable of emitting light for itself. Hence, sub-pixels may have inorganic light emitting devices that emit different colors of light. For example, a red inorganic light emitting device may be arranged in the red sub-pixel SP (R), a green inorganic light emitting device may be arranged in the green sub-pixel SP (G), and a blue inorganic light emitting device may be arranged in the blue sub-pixel SP (B).

Figure 2:
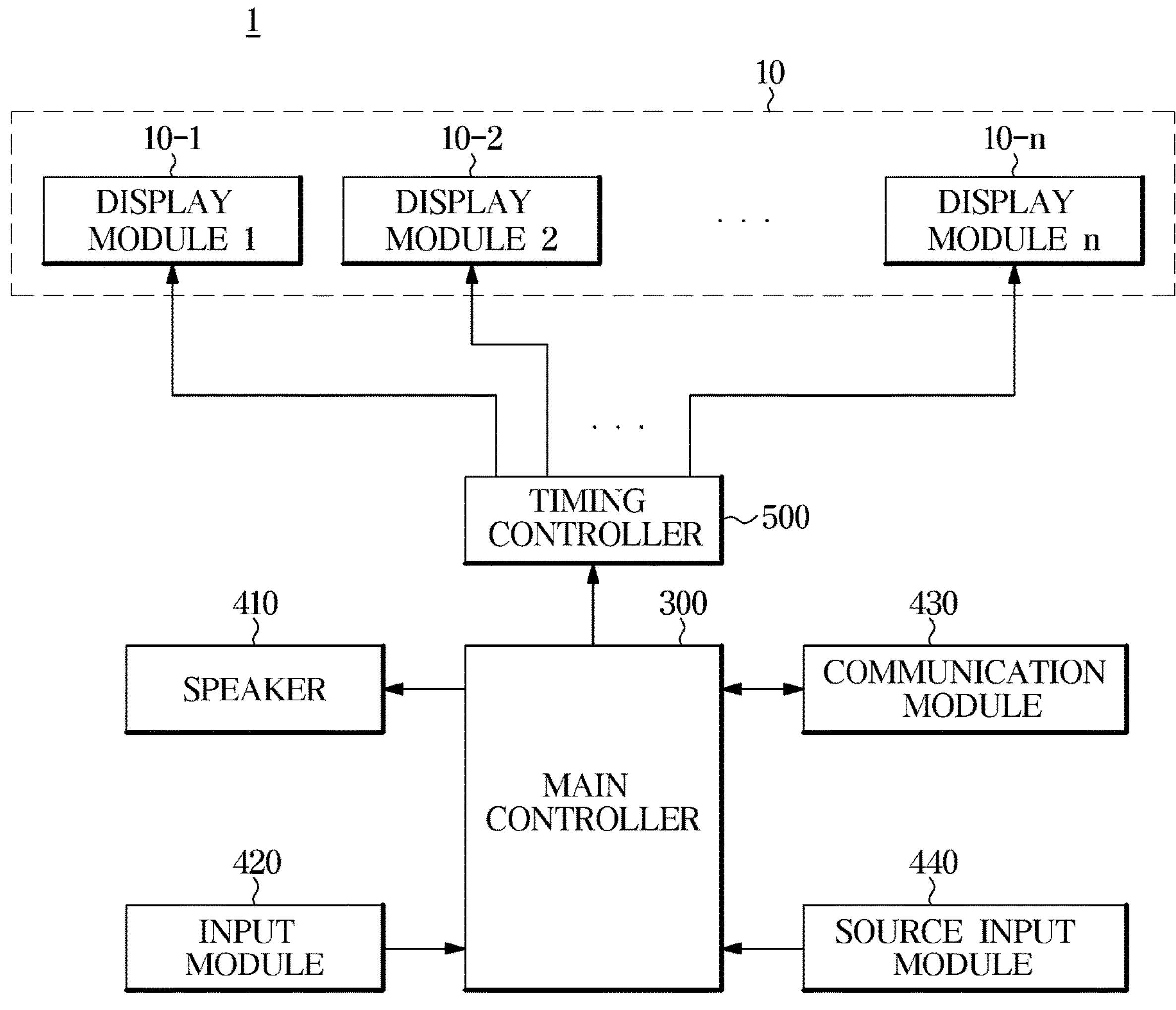
FIG. 2 is a control block diagram of a display device, according to one or more embodiments.

FIG. 2 is a control block diagram of the display device 1, according to one or more embodiments.

As described above in connection with FIG. 1, the display device 1 may include a plurality of display modules 10-1, 10-2, . . . , 10-*n*, where n is an integer equal to or greater than 2, a main controller 300 and timing controller 500 for controlling the plurality of display modules 10, a communication module 430 for communicating with an external device, a source input module 440 for receiving a source image, a speaker 410 for outputting sound, and an input module 420 for receiving a command to control the display device 1 from a user.

The input module 420 may include a button (buttons) or a touch pad arranged in a region of the display device 1, or the input module 420 may include a touch pad arranged on the front surface of a display panel 100 (see FIG. 4) when the display panel is implemented as a touch screen. It is also possible for the input module 420 to include a remote controller.

The input module 420 may receive various commands from the user to control the display device 1, such as power on/off, volume control, channel tuning, screen adjustment, various settings change, etc.

The speaker 410 may be arranged in a portion of the chassis assembly 20, or an extra speaker module physically separated from the chassis assembly 20 may be further provided.

The communication module 430 may communicate with a relay server or another electronic device to exchange data required. The communication module 430 may employ at least one of various radio communication methods such as third generation (3G), fourth generation (4G), wireless local area network (WLAN), wireless fidelity (Wi-Fi), Bluetooth, Zigbee, Wi-Fi direct (WFD), ultra-wideband (UWB), infrared data association (IrDA), Bluetooth low energy (BLE), near field communication (NFC), Z-wave, etc. It is also possible to employ a wired communication method such as peripheral component interconnect (PCI), PCI-express, universal serial bus, etc.

The source input module 440 may receive a source signal input from a set-top box, a USB, an antenna, etc. Hence, the source input module 440 may include at least one selected from a source input interface group including a high-definition multimedia interface (HDMI) cable port, a USB port, an antenna, etc.

The source signal received by the source input module 440 may be processed by the main controller 300 and converted into a format that may be output from the display panel and the speaker 410.

The controller 300 and the timing controller 500 may include at least one memory for storing a program and various types of data to perform operations, which will be described later, and at least one processor for executing the stored program.

The main controller 300 may process the source signal input through the source input module 440 to create an image signal corresponding to the input source signal.

For example, the main controller 300 may include a source decoder, a scaler, an image enhancer and a graphic processor. The source decoder may decode a source signal compressed in such a format as MPEG, and the scaler may output image data of a desired resolution through resolution conversion.

The image enhancer may enhance image quality of the image data by applying various correction techniques. The graphic processor may sort pixels of the image data into RGB data, and output the RGB data along with a control signal such as a syncing signal for display timing on the display panel. In other words, the main controller 300 may output image data corresponding to a source signal with a control signal.

The aforementioned operations of the main controller 300 are merely an example that is applicable to the display device 1, and an additional operation may be further performed or some of the aforementioned operations may be omitted.

The image data and control signal output from the main controller 300 may be sent to the timing controller 500.

The timing controller 500 may convert the image data sent from the main controller 300 into a format that may be processed in a driver integrated circuit (IC) and generate various control signals such as a timing control signal required to display the image data on the display panel.

According to one or more embodiments, it is not necessary for the display device 1 to include the plurality of display modules 10. Accordingly, the display device 1 may include one display module 10 or the plurality of display modules 10.

Figure 3:
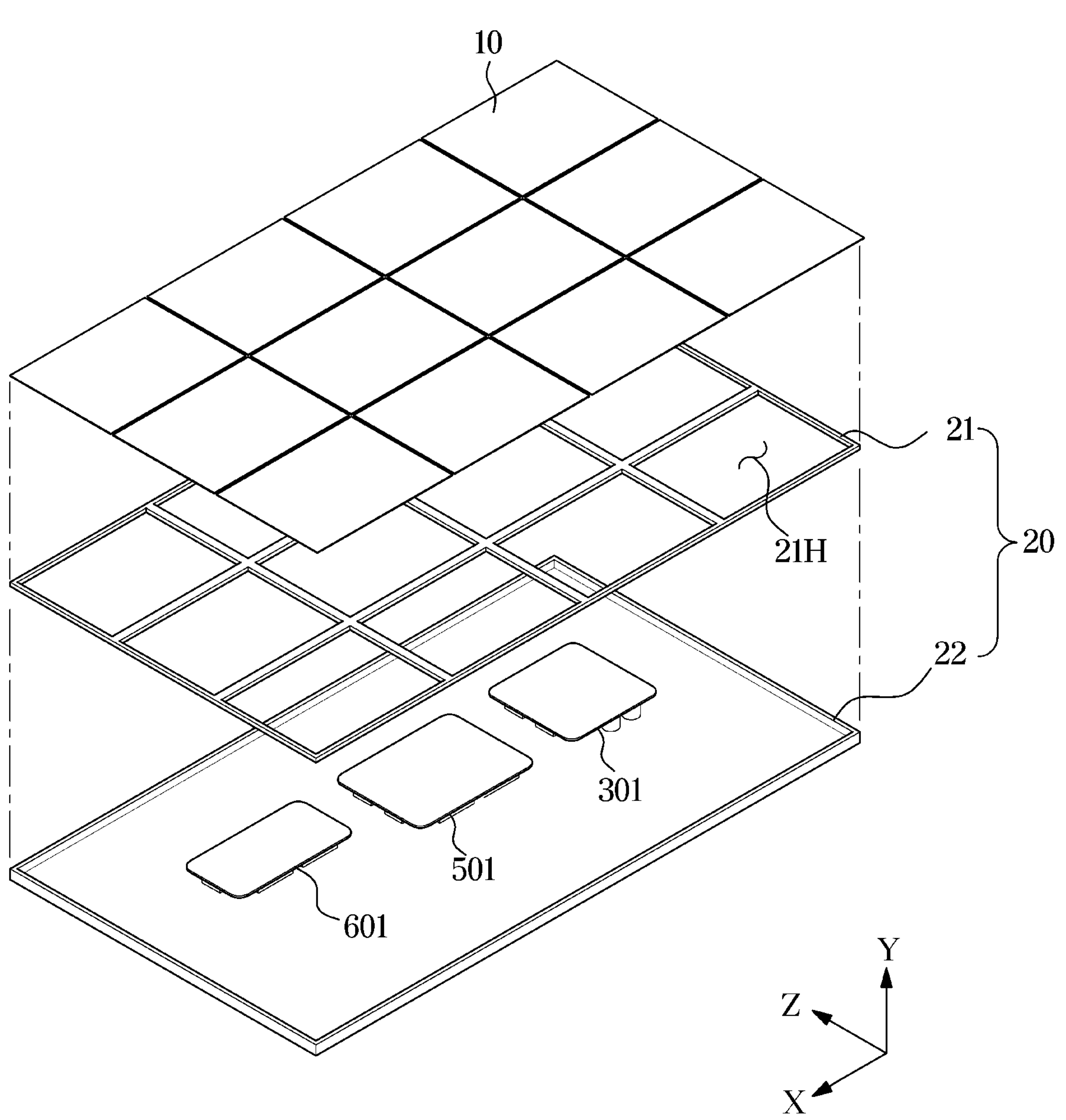
FIG. 3 is a view illustrating how a plurality of display modules are coupled to a chassis assembly in a display device, according to one or more embodiments.

FIG. 3 is a view illustrating how the plurality of display modules 10 are coupled to the chassis assembly 20 in the display device 1, according to one or more embodiments.

The plurality of display modules 10 may be arranged in the form of a 2D matrix and fixed to the chassis assembly 20. Specifically, the chassis assembly 20 may be arranged to match the number of display modules 10. Referring to FIG. 3, the plurality of display modules 10 may be installed on a frame 21 located under them, and the frame 21 may have a 2D mesh structure with some regions corresponding to the plurality of display modules 10 open.

Specifically, as many openings 21H as the number of the display modules 10 may be formed at the frame 21, and the openings 21H may have the same layout as the plurality of display modules 10.

The plurality of display modules 10 may be mounted on the frame 21 in a method that uses magnetic force of a magnet, coupling by a mechanical mechanism, or adhesion by an adhesive. There are no limitations on how the display module 10 is mounted on the frame 21.

Referring to FIG. 3, the display module 10 may be coupled to the chassis assembly 20 in the rearward direction −Y of the display module 10. Furthermore, the display module 10 may also be coupled in a way that at least one direction of a bottom side direction +Z and the rearward direction −Y or at least one end of a top end and/or a bottom end and/or a side end of the display module 10 is first coupled to the chassis assembly 20 and the other ends are coupled thereto later on. However, embodiments are not limited thereto.

According to one or more embodiments, the display module 10 of the display device 1 may have a coupling direction and method that changes depending on a position of a connector for supplying module power as will be described in detail later.

A main board 301, a driving board 501 and a power board 601 may be arranged under the frame 21, and electrically connected to the plurality of display modules 10 through openings 21H formed at the frame 21.

A bottom cover 22 may be coupled to the bottom of the frame 21, and the bottom cover 22 may form a rear exterior of the display device 1.

As shown in FIG. 3, the main board 301, the driving board 501 and the power board 601 may be arranged in the forward direction +Y of the bottom cover 22. It is not, however, limited thereto, and when the plurality of the display modules 10 are provided, the main board 301, the driving board 501 and the power board 601 may be provided in the plural to match the chassis assembly 20 to which the respective display modules 10 are coupled.

Referring to FIG. 3, the main board 301, the driving board 501 and the power board 601 are each provided separately, without being limited thereto. According to one or more embodiments, a driving circuit may be implemented as a printed circuit board (PCB) formed to include at least one of the main board 301, the driving board 510 and the power board 610. Accordingly, the driving circuit may be arranged in each opening 21H or may be arranged as one unit to control the plurality of display modules 10.

According to one or more embodiments, the display modules 10 may be arranged in 2D, but the display modules 10 may also be arranged in one dimension (1D), in which case the structure of the frame 21 may also be modified into a 1D mesh structure.

Figure 4:
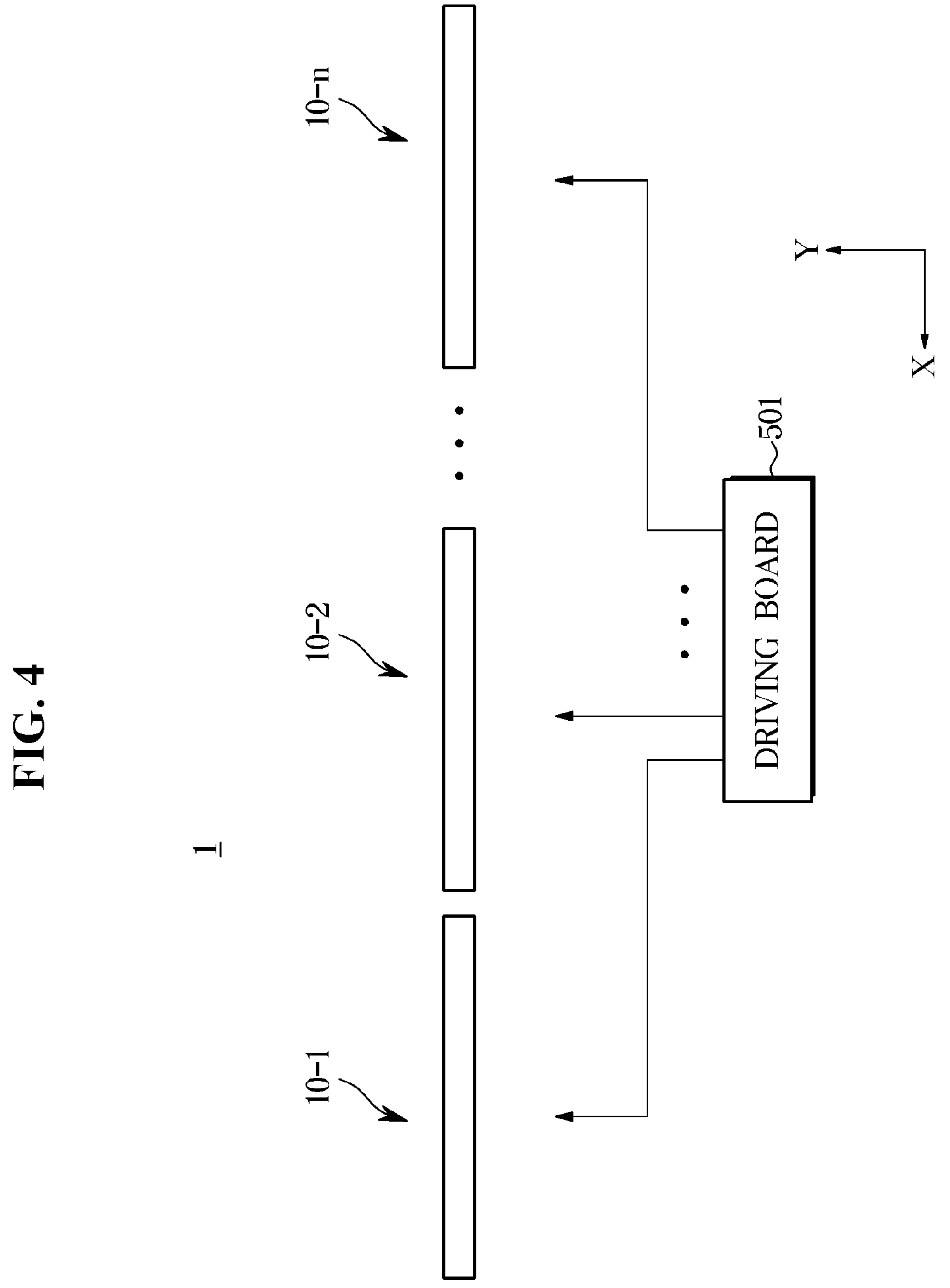
FIG. 4 illustrates signals sent to a plurality of tiled display modules of a display device, according to one or more embodiments.
Figure 5:
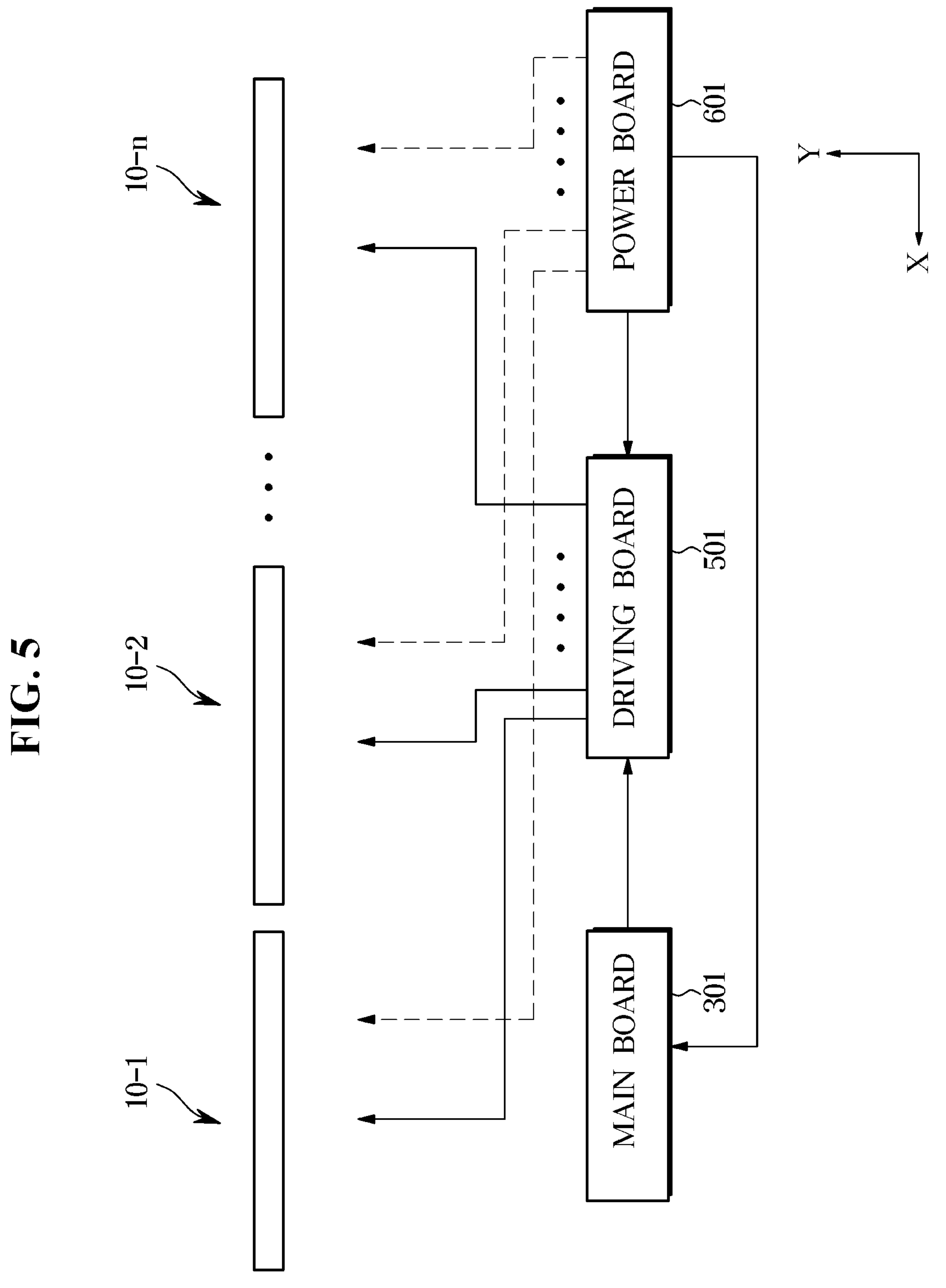
FIG. 5 illustrates signals sent to a plurality of tiled display modules of a display device, according to one or more embodiments.

FIGS. 4 and 5 illustrate signals sent to the plurality of tiled display modules 10 of the display device 1, according to one or more embodiments.

Referring to FIG. 4, the plurality of display modules 10-1, 10-2, . . . , and 10-*n* may be tiled to implement the display device 1 having a large-area screen. As FIGS. 4 and 5 show the display device 1 on the plane XY, although the display modules 10-1, 10-2, . . . , 10-*n* just appear in 1D array, but the plurality of display modules 10-1, 10-2, . . . , and 10-*n* may be arranged in 2D as described above with reference to FIG. 1.

The display panel may be connected to a PCB on which a driver integrated circuit (IC) is mounted. The PCB may be implemented as e.g., a flexible PCB (FPCB). The PCB may be connected to the driving board 501 to electrically connect the display module 10 to the driving board 501.

The timing controller 500 may be arranged on the driving board 501. Hence, the driving board 501 may also be referred to as a T-con board. The plurality of display modules 10-1, 10-2, . . . , and 10-*n* may receive image data, a timing control signal, etc., from the driving board 501.

Referring to FIG. 5, the display device 1 may further include the main board 301 and the power board 601. The aforementioned main controller 300 may be provided on the main board 301, and a power circuit required to supply power to the plurality of display modules 10-1, 10-2, . . . , and 10-*n* may be provided on the power board 601.

The power board 601 may be electrically connected to the plurality of display modules 10-1, 10-2, . . . , and 10-*n* through the PCB, and may apply power voltage $V_{DD}$, reference voltage $V_{SS}$, etc., to the plurality of display modules 10-1, 10-2, . . . , and 10-*n* connected through the PCB.

Although the plurality of display modules 10-1, 10-2, . . . , and 10-P are described in the aforementioned example as sharing the driving board 501, it is also possible that a separate driving board 501 is connected to each display module 10 of the plurality of display modules 10-1, 10-2, . . . , and 10-P. Alternatively, it is also possible to group the plurality of display modules 10-1, 10-2, . . . , and 10-P and connect one driving board 501 to each group.

Figure 6:
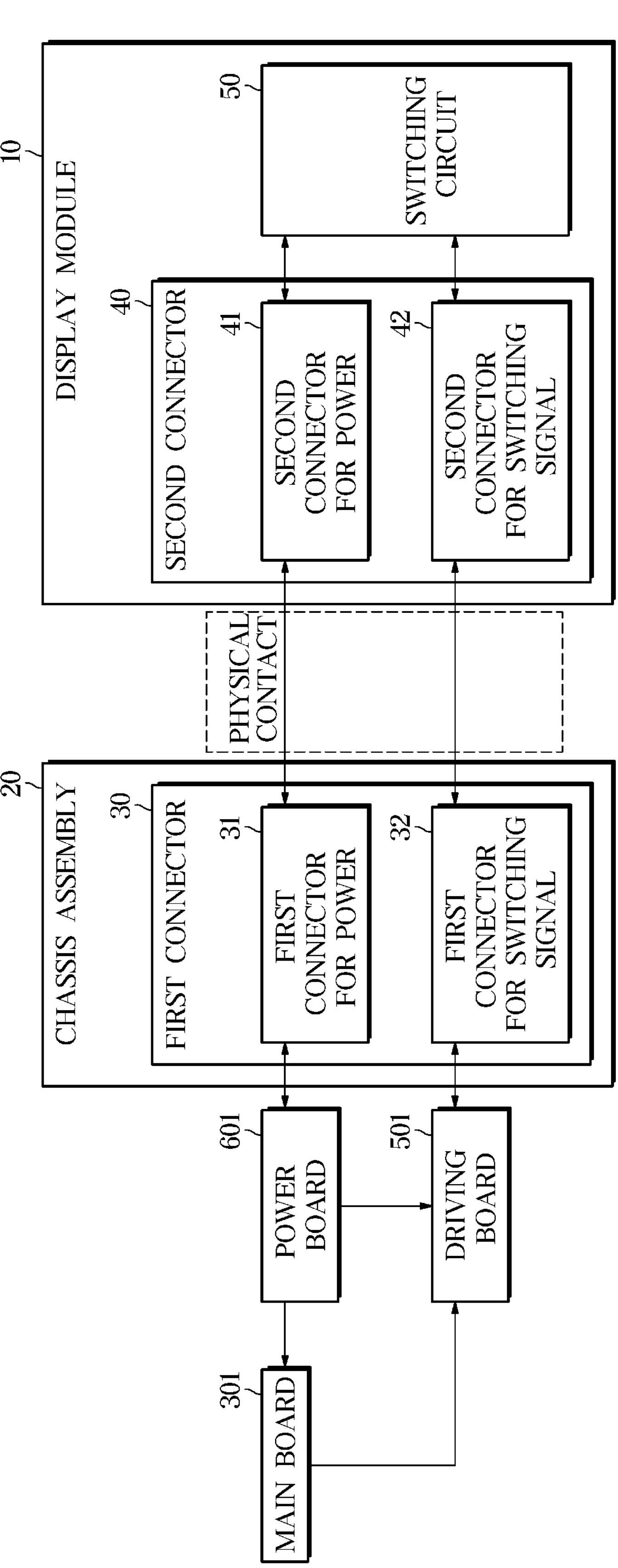
FIG. 6 is a block diagram illustrating a configuration of a display device, according to one or more embodiments.

FIG. 6 is a block diagram illustrating a configuration of the display device 1, according to one or more embodiments.

Referring to FIG. 6, the display device 1 according to one or more embodiments may include the main board 301, the driving board 501, the power board 601, the display module 10 and the chassis assembly 20.

The main board 301, the driving board 501 and the power board 601 may be equipped on a side of the rear cover 22 of the chassis assembly 20 in the forward direction +Y as described above, to be structurally included in the chassis assembly 20. As shown in FIG. 6, each arrow may indicate possibility of being electrically connected. Being electrically connected may mean being connected by a PCB circuit, a cable, or a conductive wire including physical contact to transmit or receive power and/or data signals.

The chassis assembly 20 may receive and support the display module 10. According to one or more embodiments, the chassis assembly 20 may support the display module 10 by using magnetic force of a magnet or by a mechanical structure, or support the display module 10 by being bonded by an adhesive. There is no limitations on how the chassis assembly 20 supports the display module 10.

The chassis assembly 20 forms a space to receive the display module 10 including the display panel and the driving circuit including the main board 301, the driving board 501, the power board 601, etc., and other components of the display device 1 such as a backlight unit. The driving circuit and the backlight unit are common components of the display device 1.

The chassis assembly 20 may include a first connector for power (or first power connector) 31 and a first connector for switching signal (or first switching signal connector) 32. The first connector 30 may be mounted on the driving circuit formed as a PCB including, for example, the main board 301, the driving board 501 and/or the power board 601. According to one or more embodiments, the first connector 30 may be mounted on a PCB arranged separately from the power board 601 and/or the driving board 510.

The first connector 30 and the second connector 40 may be a female connector and a male connector, respectively, or a male connector and a female connector, respectively. In other words, the chassis assembly 20 may include a female connector including a female connector for power and a female connector for supplying signals, or may include a male for power and a male connector for supplying signals. It is not limited thereto.

The driving circuit formed as one PCB including the main board 301, the driving board 501 and/or the power board 601 may be electrically connected to each first connector 30, but for convenience of explanation, each will be separately described to express a flow of an electrical signal. It is not limited thereto.

The first connector 30 may be arranged to have an area facing the second connector 40 arranged on the display module 10. Hence, it will be understood that the location of the first connector 30 may be changed by the location of the second connector 40. As the first connector 30 has the area facing the second connector 40, the second connector 40 has a movement range within a range of the area even while the first connector 30 is in contact with the second connector 40.

The area of the first connector 30 may be determined, when the display module 10 is coupled to the chassis assembly 20, based on, according to one or more embodiments, a limit movement amount of the display module 10 set based on the coupling method and coupling structure, and a design. For example, the limit movement amount may refer to a movement range within which the display module 10 may move along the X-axis and/or the Y-axis and/or the Z-axis in the chassis assembly 20 when the display module 10 and the chassis assembly 20 are coupled to and/or decoupled from each other. Accordingly, it may be understood that a limit movement amount of the second connector 40 arranged on the display module 10 may be the same as the limit movement amount of the display module 10.

For example, when the display module 10 moves at most 1 cm from the center to a side direction (the Z-axis or the X-axis) while coupled to the chassis assembly 20, the area may be determined to have a circular form with 1 cm or larger from the center. Areas of the first connector for power 31 and the first connector for switching signal included in the first connector 30 are different from each other, and the area of the first connector for switching signal 32 may be smaller than the area of the first connector for power 31 so that the first connector for switching signal 32 and the second connector 40 may contact later than contact between the first connector for power 31 and the second connector 40.

Furthermore, for example, in a case that the second connector 40 is formed to face the rearward direction −Y of the display module 10, the area of the first connector 30 may be determined based on a limit movement amount of a side direction (the X-axis, the Z-axis) of the second connector 30 when the display module 10 is coupled to and decoupled from the chassis assembly 20.

The area form of the first connector 30 has no limitations.

The first connector 30 may include a conductor including a conductive material that becomes conductive through physical contact with the second connector 40. In other words, the first connector 30 has an area of the conductor to face the second connector 40, so that the first connector 30 may be electrically connected to the second connector 40 even when the second connector 40 does not match the first connector 30.

The first connector for power 31 may be electrically connected to the power board 601. Hence, the first connector for power 31 is able to transmit and receive electrical signals to and from the power board 601. The electrical signals may be, for example, electrical signals including power to supply required power to the display module 10 from the power board 601. It is not limited thereto, but for convenience of explanation, the electrical signal transmitted by the power board 601 to the first connector for power 31 may be called a power signal including power, which will be described later.

The first connector for power 31 may receive the power signal from the power board 601, and transmit the received power signal to the second connector 40 electrically connected by physical contact. In other words, the first connector for power 31 is arranged to have an area facing the second connector 40 to transmit the power signal to the second connector 40 when the second connector 40 makes contact with the area of the conductive material.

The first connector for power 31 may include, for example, a first connector for power to transmit and receive at least one power signal and a first connector for power to provide at least one ground. That is, it is not limited to the number of the first connectors for power 31. For example, the first connector for power 31 may include a first connector for power to provide four grounds and a first connector for power to transmit and receive four power signals.

The first connector for switching signal 32 may be electrically connected to the driving board 501. Accordingly, the first connector for switching signal 32 is able to transmit and receive electrical signals to and from the driving board 501. The electrical signals may be switching signals and/or image signals transmitted to apply the power signal output from the power board 601 to the display module 10. It is not limited thereto, but for convenience of explanation, the electrical signal transmitted by the driving board 601 to the first connector for switching signal 32 may be called a switching signal to apply the power signal received from the power board 601 to drive the display module 10, which will be described below.

Hence, the first connector for switching signal 32 may receive the switching signal from the driving board 501, and transmit the received switching signal to the second connector 40 through physical contact. In other words, the first connector for switching signal 32 is arranged to have an area facing the second connector 40 to transmit the switching signal to the second connector 40 when making contact with the second connector 40.

There are no limitations on the number of the first connectors for switching signal 32. The number may vary by a design of the switching circuit 50 of the display module 10 and/or a configuration of the driving circuit.

The display module 10 may include the second connector 40 that may transmit and receive electrical signals when in contact with the first connector 30, and the switching circuit 50.

The second connector 40 may include an electrode formed of a conductor that protrudes outward and is formed to contract and/or relax in the protruding direction. This may enable the second connector 40 to transmit and receive the power and/or switching signal to and from the first connector 30 by making contact with the area of the first connector 30 arranged to face the second connector 40.

The second connector 40 may include a second connector for power (or second power connector) 41 to transmit and receive the power signal to and from the first connector for power 31 when in contact with the first connector for power 31, and a second connector for switching signal (or second switching signal connector) 42 to transmit and receive the switching signal from the first connector for switching signal 32 when in contact with the first connector for switching signal 32.

The switching circuit 50 may be electrically connected to the second connector for power 41 and/or the second connector for switching signal 42 to transmit and receive the power signal to and from the second connector for power 41 and/or the switching signal from the second connector for switching signal 42.

Specifically, the driving board 501 may transmit the switching signal to the first connector for switching signal 32. Accordingly, the first connector for switching signal 32 may deliver the switching signal to the second connector for switching signal 42 electrically connected by physical contact. In this case, the switching circuit 50 may receive the switching signal from the second connector for switching signal 42.

Furthermore, the power board 601 may transmit the power signal to the first connector for power 31. Accordingly, the first connector for power 31 may deliver the power signal to the second connector for power 41 electrically connected by physical contact. In this case, the switching circuit 50 may receive the power signal from the second connector for power 41.

Accordingly, the switching circuit 50 may receive the switching signal received from the driving board 501 from the second connector for switching signal 42 and receive the power signal received from the power board 601 from the second connector for power 41.

The switching circuit 50 may apply the power signal received from the second connector for power 41 to the display module 10 in response to the switching signals being received from the second connector for switching signal 42. In other words, the switching circuit 50 may be configured not to transmit the power signal to the display module 10 in a case in which the switching signal is not received from the second connector for switching signal 42 even when receiving the power signal from the second connector for power 41.

Specifically, when not receiving the switching signal, the switching circuit 50 may maintain the first connector for power 31 and the second connector for power 41 not to have a current flowing between them by making electrical connection between the switching circuit 50 and the display module 10 remain in an open state.

In summary, when the switching circuit 50 receives both the power signal and the switching signal from the second connector for power 41 and the second connector for switching signal 42, the display device 1 may show an image by applying (shortening) the power signal to the display module 10.

The chassis assembly 20 may further include guide molding to guide the second connector 40 and/or the first connector 30 when coupled to the display module 10. Specifically, the guide molding is equipped in the chassis assembly 20 or equipped in the display module 10. For example, when equipped in the chassis assembly 20, the guide molding is arranged in the form of enclosing the first connector 30 not to expose the first connector 30 and the second connector 40 to the outside when the second connector 40 is settled in (contacting) the first connector 30. However, it is not limited thereto.

Discharging is an insulation breakdown phenomenon that occurs when there is a space between conductive electrodes, making the air changed into a conductive medium. Specifically, when a space is created between current-flowing electrodes, there is a potential difference that leads to arc discharge, causing a problem of reduction in device durability due to high temperature.

The arc discharge often occurs when connector pins of a contact-type connector structure that is conductive by physical coupling between electrodes to transmit and receive an electrical signal and/or a power signal are moved (coupled or decoupled). According to one or more embodiments, the display device 1 may prevent the arc discharge in the mechanical contact-type connector structure. However, it is not limited thereto.

Figure 7:
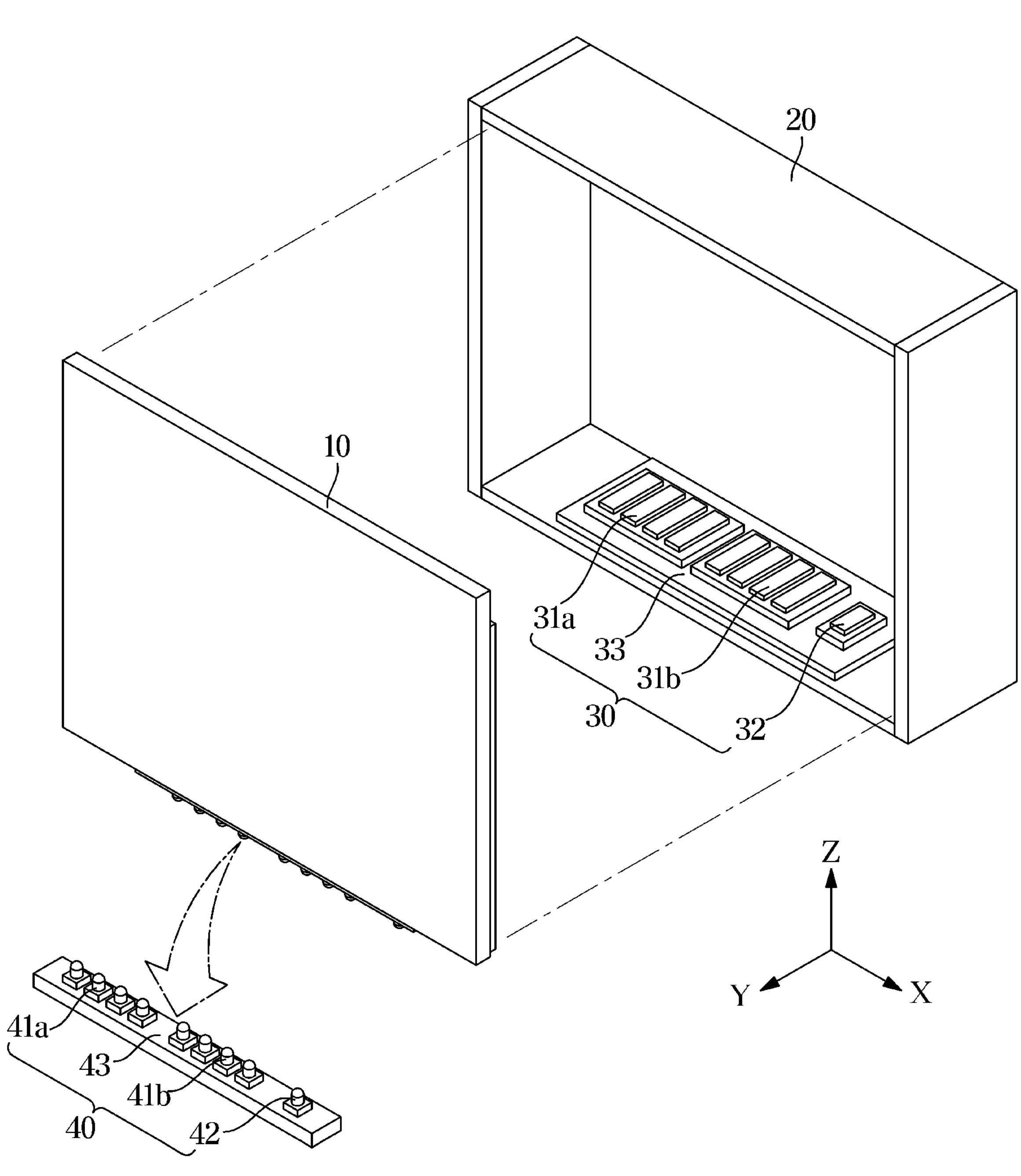
FIG. 7 is a perspective view illustrating ways and structures of physically connecting display modules and a chassis assembly of a display device, according to one or more embodiments.
Figure 8:
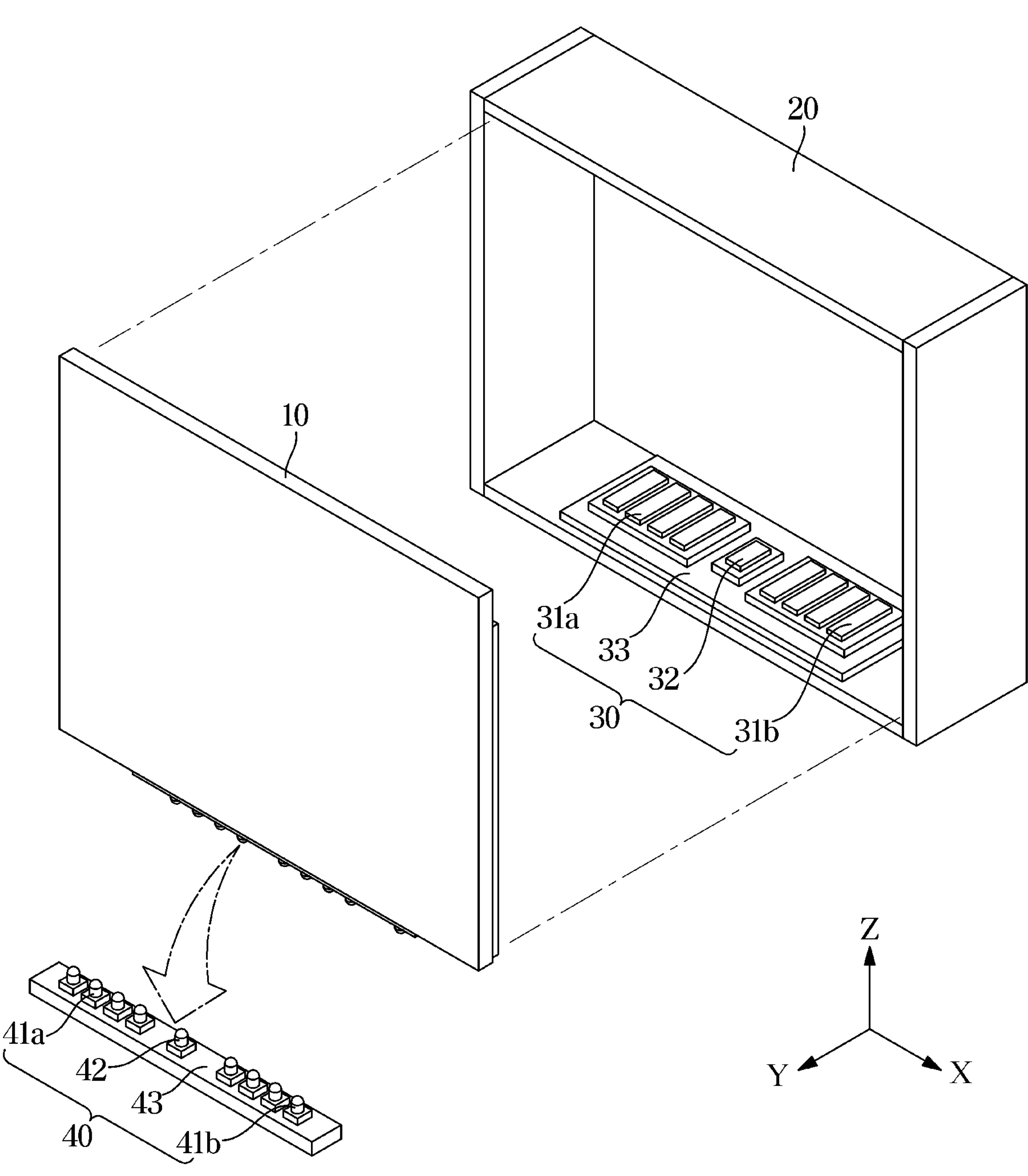
FIG. 8 is a perspective view illustrating ways and structures of physically connecting display modules and a chassis assembly of a display device, according to one or more embodiments.

FIGS. 7 and 8 illustrate ways and structures of physically connecting the display module 10 and the chassis assembly 20 of the display device 1, according to one or more embodiments.

Referring to FIG. 7, the display module 10 may have the second connector 40 arranged in the downward direction −Z. As shown, the second connector 40 may be placed on a PCB 43 arranged at a side end in the downward direction −Z of the display module 10, or placed on the PCB 43 in the downward direction −Z on which a circuit of the display module 10 is arranged in the rearward direction −Y. Hence, the conductive electrode included in the second connector 40 may be arranged, e.g., in the downward direction −Z.

The second connector 40 is not limited to being placed on the PCB 43, but may be electrically connected to the PCB 43 arranged in a different location. Accordingly, the first connector 30 is shown as being arranged on the PCB 33 as well, but may be electrically connected to the PCB 33 arranged at a different location.

As shown in FIG. 7, the second connector 40 may include, for example, a second connector for power **41*a* that may receive the power signal from a first connector for power 31*a* that transmits and receives the power signal, a second connector for power 41*b* that is electrically conducted and grounded from a first connector for power 31*b* that provides ground, and the second connector for switching signal 42 that may receive the switching signal from the first connector for switching signal 32**.

Accordingly, the first connector 30 may include, for example, the first connector **31*a* for supplying the power signal, which has an area to face the second connector for power 41*a* to receive the power signal, the first connector for power 31*b* to provide ground, which has an area to face the second connector 41*b* for power that may contact the ground, and the first connector for switching signal 32 which has an area to face the second connector for switching signal 42** to receive the switching signal.

Referring to FIG. 7, the first connector for switching signal 32 may be formed to have a length of an area of the direction −Y in which the display module 10 is coupled thereto shorter than the length of the first connector for power **31*a* and 31*b*. In other words, length in a direction of the Y-axis of a conductor area included in the second connector for switching signal 32 may be smaller than the length in the direction of the Y-axis of a conductor area included in the first connector for power 31*a* and 31*b* by a preset length. The preset length may be obtained experimentally and/or empirically according to a limit movement amount of the second connector 30**, which may be given different contact timing as will be described later. However, it is not limited thereto.

Accordingly, when the display module 10 is coupled to the chassis assembly 20 in the rearward direction −Y, the second connector **41*a* or 41*b* for power contacts the first connector for power 31*a* or 31*b* first and becomes conductive, and then the second connector for switching signal 42 contacts the first connector for switching signal 32 and becomes conductive, so that a time for the second connector for power 41*a* or 41*b* and the first connector for power 31*a* or 31*b* to be conductive may be different from a time for the second connector for switching signal 42 and the first connector for switching signal 32** to be conductive.

Hence, the power signal received by the second connector for power **41*a* is first applied to the switching circuit 50 of the display module 10 and then, the switching signal received by the second connector for switching signal 42 is applied to the switching circuit 50 of the display module 10, so the switching circuit 50 may apply the received power signal to the display module 10 in response to the receiving of the switching signal, thereby turning on the display module 10**.

Referring to FIG. 7, in a case that the display module 10 and the chassis assembly are broken up (decoupled), the display module 10 may be decoupled from the chassis assembly 20 in the forward direction +Y. Before the decoupling, the display device 1 may be in a state in which the second connector for power **41*a* and 41*b* and the first connector for power 31*a* and 31*b* of the display module 10** are electrically connected and the second connector for switching signal 42 and the first connector for switching signal 32 are electrically connected. In this case that the display module 10 is decoupled in the forward direction +Y, as the length of the first connector for switching signal 32 in the forward direction +Y is smaller than the length of the first connector for power 31*a* and 31*b* in the forward direction by a preset length, contact between the first connector for switching signal 32 and the second connector for switching signal 42 may be released earlier than contact between the first connector for power 31*a* and 31*b* and the second connector for power 41*a* and 41*b*.

The length of the first connector for switching signal 32 in the forward direction +Y is set to be smaller than the length of the first connector for power 31*a* and 31*b* in the forward direction +Y, and the center of the area of the first connector for switching signal 32 and the center of the area of the first connector for power 31*a* and 31*b* may be arranged in a line parallel to the X-axis. Hence, even when the display module 10 moves to one of the forward direction +Y and/or the rearward direction −Y with respect to the center of the area of the first connector for power 31*a* and 31*b*, contact between the first connector for switching signal 32 and the second connector for switching signal 42 may be released earlier than contact between the first connector for power 31*a* and 31*b* and the second connector for power 41*a* and 41*b*. However, it is not limited thereto.

According to one or more embodiments, in a case that the display module 10 is decoupled in the forward direction +Y when an end of the area of the first connector for power 31*a* and 31*b* in the rearward direction −Y and an end of the area of the first connector for switching signal 32 in the rearward direction −Y are placed in a line parallel to the X-axis, contact between the first connector for switching signal 32 and the second connector for switching signal 42 may be released earlier than contact between the first connector for power 31*a* and 31*b* and the second connector for power 41*a* and 41*b*.

Accordingly, the contact between the first connector for switching signal 32 and the second connector for switching signal 42 is released first and gets into an open state, and the first connector for power 31*a* and 31*b* and the second connector for power 41*a* and 41*b* are short-circuited, so that the second connector for switching signal 42 is unable to receive the switching signal from the first connector for switching signal 32. In this case, the switching circuit 50 opens the electrical connection with the display module 10 for supplying power in response to no switching signal received to prevent a current from flowing between the second connector for power 41*a* and 41*b* and the first connector for power 31*a* and 31*b* even while the second connector for power 41*a* and 41*b* and the first connector for power 31*a* and 31*b* are in contact with each other. Specifically, while the second connector for power 41*a* and 41*b* and the first connector for power 31*a* and 31*b* are in contact with each other, i.e., electrically connected to each other, the switching circuit 50 may block a flow of current between the first connector for power 31*a* and 31*b* and the second connector for power 41*a* and 41*b* in response to no input of the switching signal, thereby preventing arc discharge that otherwise occurs when coupling between the connectors is dislocated or released.

Referring to FIGS. 7 and 8, there are no limitations to arrangement of the first connector 30 and the second connector 40. As shown in FIG. 8, the second connector for switching signal 42 may be arranged to a side +X of the second connector for power 41*a* to receive the power signal. In this case, the first connector for switching signal 32 may be arranged to a side +X of the first connector for power 31*a*.

Referring to FIG. 8, the second connector 40 may be arranged downward at the bottom of the display module 10. In this case, the first connector 30 may be arranged to have an area facing the second connector 40. However, it is not limited thereto. According to one or more embodiments, the second connector 40 may be arranged rearward on the rear side of the display module 10. In this case, the first connector 30 may be arranged to have an area facing the second connector 40. Besides, the second connector 40 may be arranged upward at the top end of the display module 10, and accordingly, the first connector 30 may be arranged downward −Z at the top end of the chassis assembly 20 to have an area facing the second connector 40.

Coupling direction is not limited to the display module 10 being coupled to the chassis assembly 20 in the rearward direction −Y. For example, referring to FIG. 8, the bottom end of the display module 10 may be first coupled to the chassis assembly 20 in the downward direction −Z, or the top may be first coupled to the chassis assembly 20 and then the bottom may be coupled.

Figure 9:
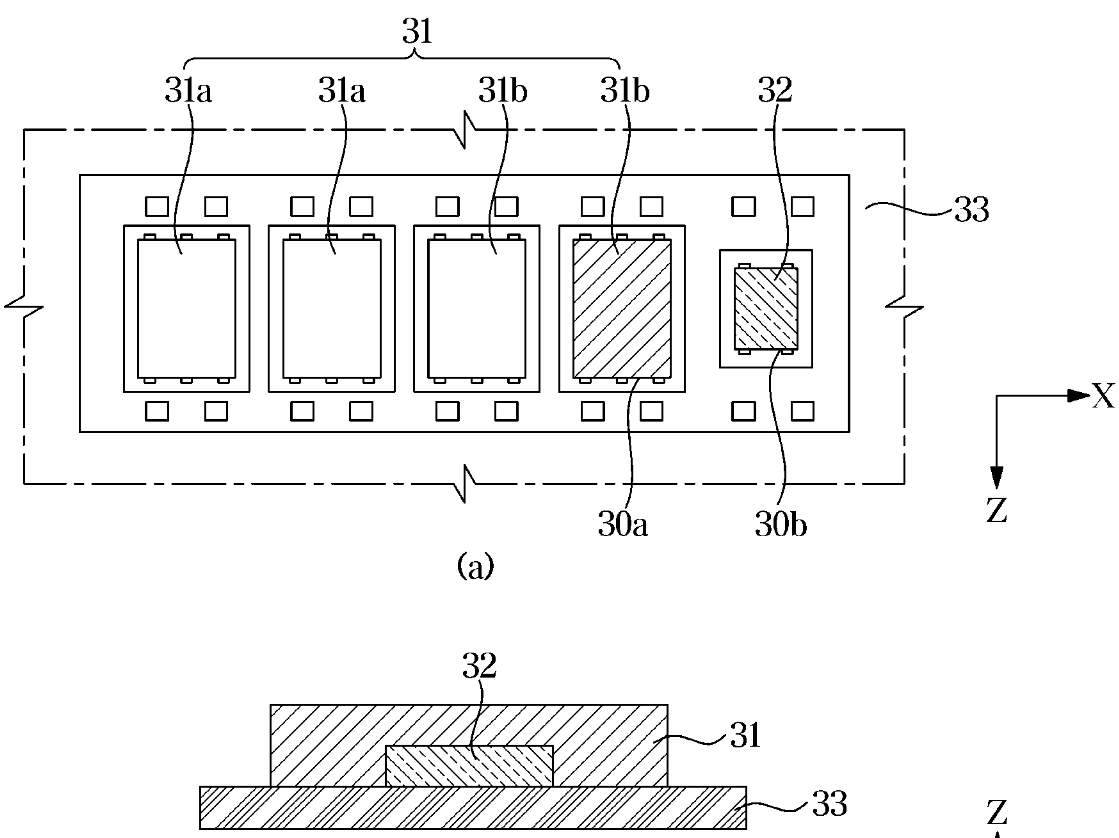
FIG. 9 is a conceptual diagram illustrating a first connector of a display device, according to one or more embodiments.

FIG. 9 illustrates the first connector 30 of the display device 1, according to one or more embodiments.

Referring to FIGS. 7 and 9, (a) of FIG. 9 is a conceptual diagram illustrating the first connector 30 arranged on the chassis assembly 20 of FIG. 7 viewed in the direction −Z from top to bottom. Furthermore, (b) of FIG. 9 is a conceptual diagram illustrating the first connector 30 arranged on the chassis assembly 20 of FIG. 7, which is viewed in the direction −X from right end to left end.

Referring to (a) of FIG. 9, the first connector 30 may include a plurality of first connectors for power 31 including the first connector for power 31*a* to transmit and receive the power signal and the first connector for power 31*b* to provide ground.

Furthermore, the first connector 30 may include the first connector for switching signals 32 to transmit and receive the switching signal. The first connector for power 31 may have an area 30*a* formed with a conductor in a direction of looking at the second connector for power 41. Furthermore, the first connector for switching signal 32 may have an area 30*b* formed with a conductor in a direction of looking at the second connector for switching signal 42.

The display module 10 may be moved not only in the coupling and decoupling directions +Y and −Y but also in the side directions +X and −X. When the display module 10 is moved in the side direction +X or −X, the contact between the first connector for power 31 and the second connector for power 41 and the contact between the first connector for switching signal 32 and the second connector for switching signal 42 are released at the same time even though the length of the area 30*b* of the first connector for switching signal 32 in the coupling and decoupling direction +Y and −Y is smaller than the length of the first connector for power 31. Hence, to prevent this, as shown in (a) of FIG. 9, the length of the area 30*b* of the first connector for switching signal 32 in the direction of the X-axis is set to be smaller than the length of the area 30*a* of the first connector for power 31 in the direction of the X-axis, enabling the contact between the first connector for switching signal 32 and the second connector for switching signal 42 to be released earlier than the contact between the first connector for power 31 and the second connector for power 42 even when the display module 10 is moved to the side direction +X or −X. This may also prevent arc discharge due to the movement of the display module 10 to the side direction +X or −X.

Referring to (a) of FIG. 9, in a case that the bottom end of the display module 10 is first coupled to the chassis assembly 20 in the downward direction −Z, the contact between the first connector for power 31 and the second connector for power 41 and contact and release between the first connector for switching signal 32 and the second connector for switching signal 42 occur at the same time, thereby having a high risk of arc discharge.

To prevent this, referring to (b) of FIG. 9, length of the first connector for power 31 in the upward direction +Z may be set to be higher than length of the first connector for switching signal 32 in the upward direction +Z by a preset length. Accordingly, even in a case that the display module 10 is coupled in the downward direction −Z, contact between the first connector for switching signal 32 and the second connector for switching signal 42 may be made at a different time later than the contact between the first connector for power 31 and the second connector for power 41.

Figure 10:
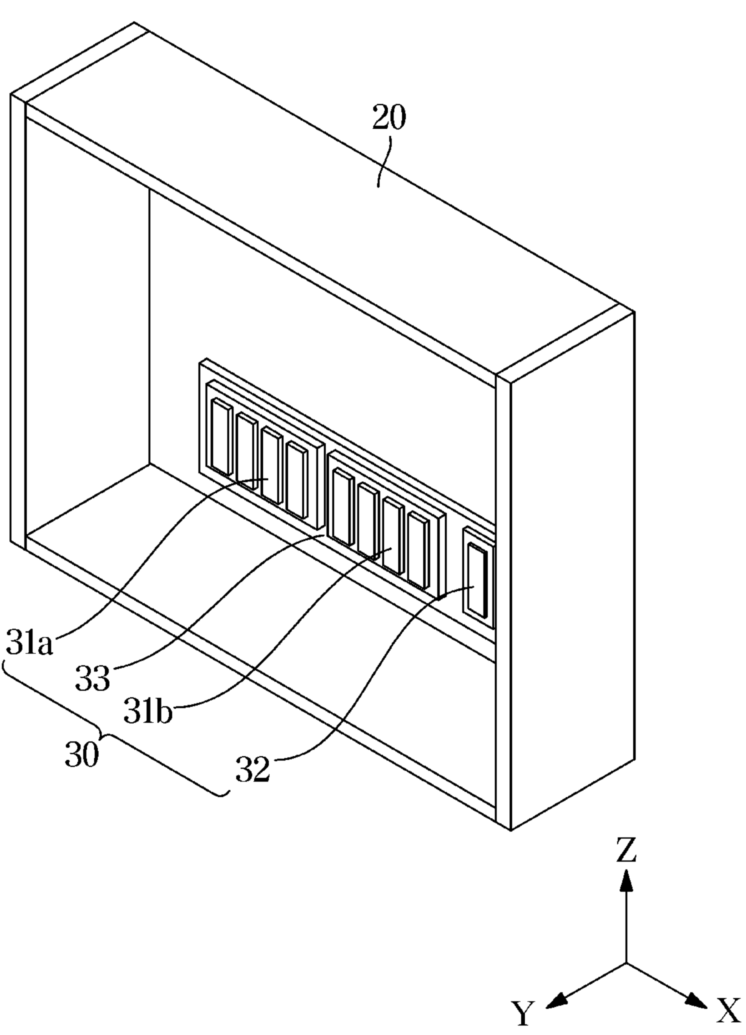
FIG. 10 is a perspective view illustrating an arrangement of a first connector of a display device, according to one or more embodiments.
Figure 11:
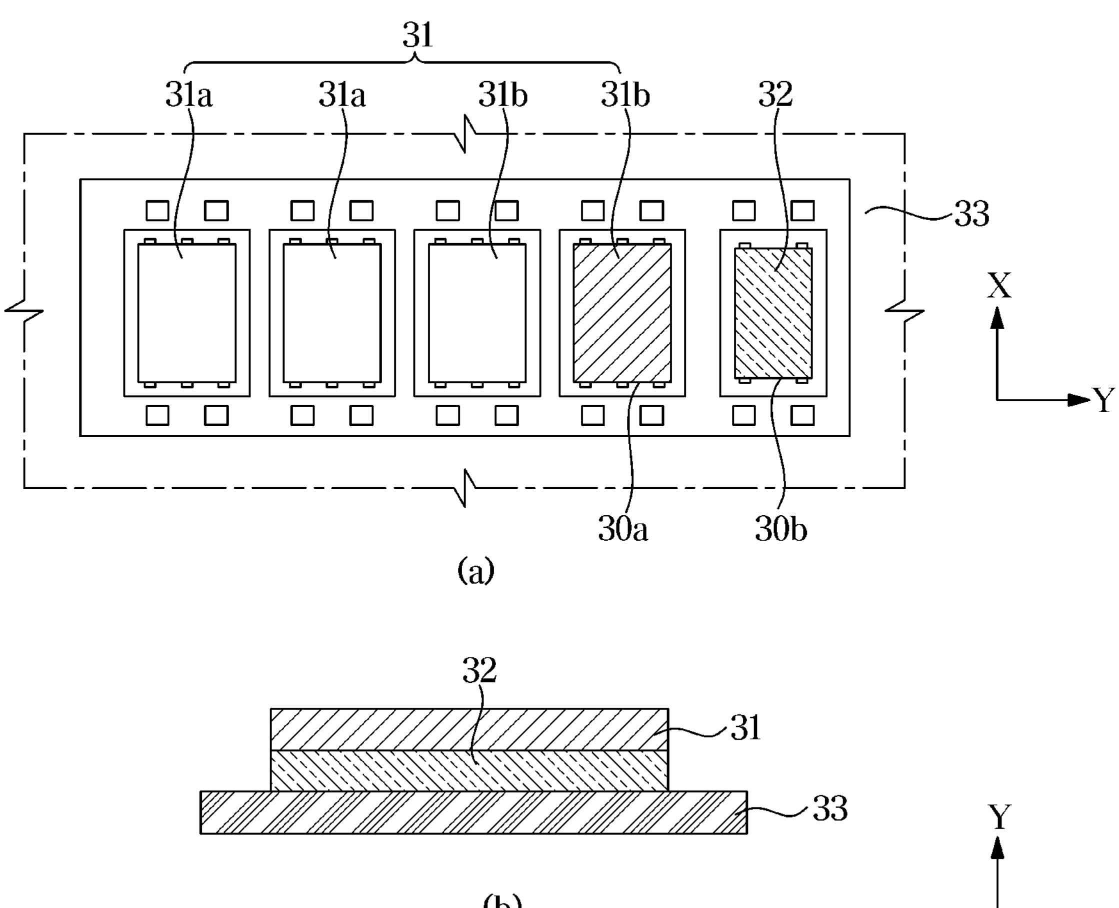
FIG. 11 is a conceptual diagram illustrating a first connector of a display device, according to one or more embodiments.

FIG. 10 illustrates arrangement of the first connector 30 of the display device 1, according to one or more embodiments. FIG. 11 is a conceptual diagram illustrating the first connector 30 of the display device 1, according to one or more embodiments.

Referring to FIG. 10, in a case that the second connector 40 is arranged in the rearward direction −Y on the rear side of the display module 10, the first connector 30 may be arranged on the front side of the chassis assembly 20 toward the forward direction +Y to face the second connector 40.

In this case, referring to (a) of FIG. 11, as the display module 10 is moved in the coupling and decoupling directions +Y and −Y, there is a need for dealing with an increase in contact rate between the second connector 40 and the first connector 30 rather than a risk of arc discharge due to the upward and downward directions +Z and −Z. Accordingly, the length of the area 32*b* in the upward and downward directions +Z and −Z of the first connector for switching signal 32 included in the first connector 30 to transmit the switching signal may be set to be equal to the length of the first connector for power 31.

Furthermore, referring to (b) of FIG. 11, as the display module 10 is moved in the coupling and decoupling directions +Y and −Y, the length of first connector for power 31 in the forward direction +Y may be set to be longer than the length of the first connector for switching signal 32 so that contact between the second connector for power 41 and the first connector for power 31 occurs first. Hence, in a case that the first connector 30 is arranged on the front side of the chassis assembly 20, arc discharge between connectors of the display device 1 may be prevented.

Figure 12:
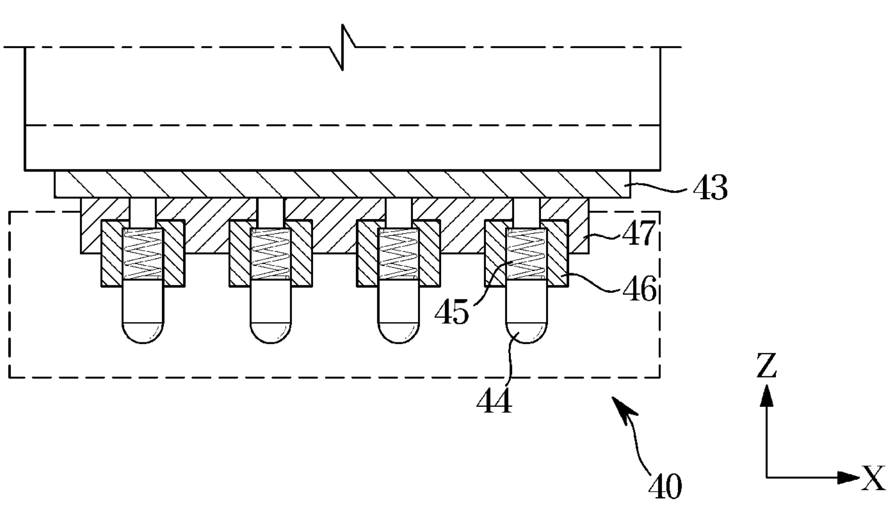
FIG. 12 illustrates a second connector of a display device, according to one or more embodiments.
Figure 13:
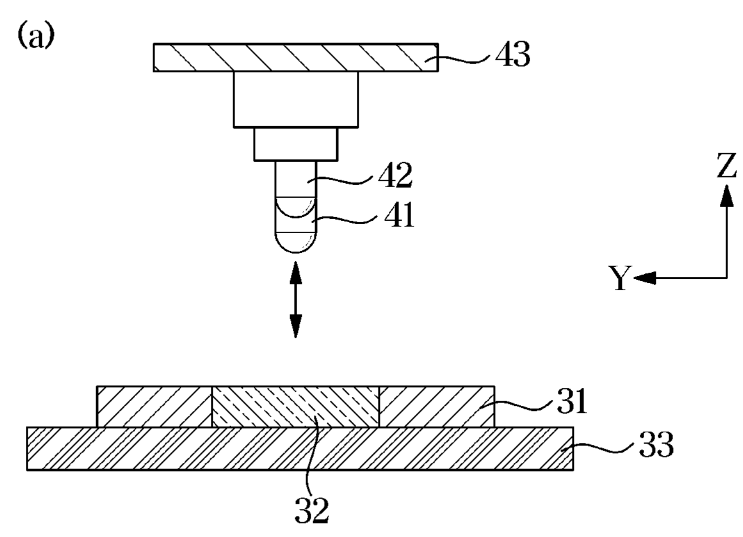
FIG. 13 illustrates a second connector of a display device, according to one or more embodiments.
Figure 13:
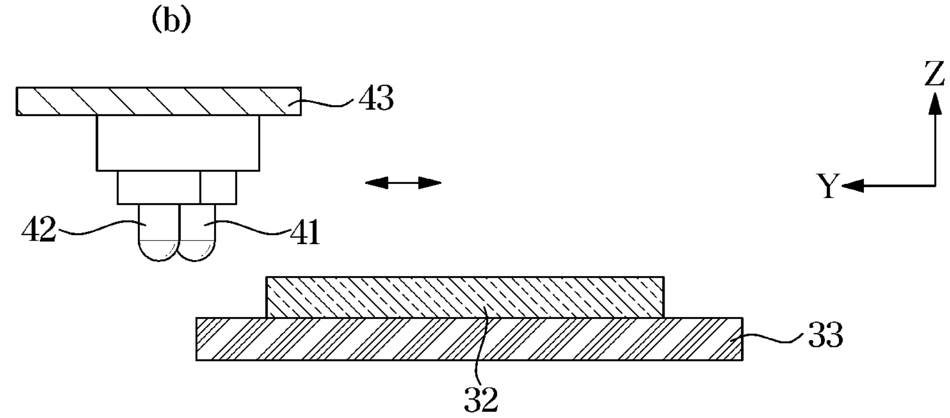
Figure 14:
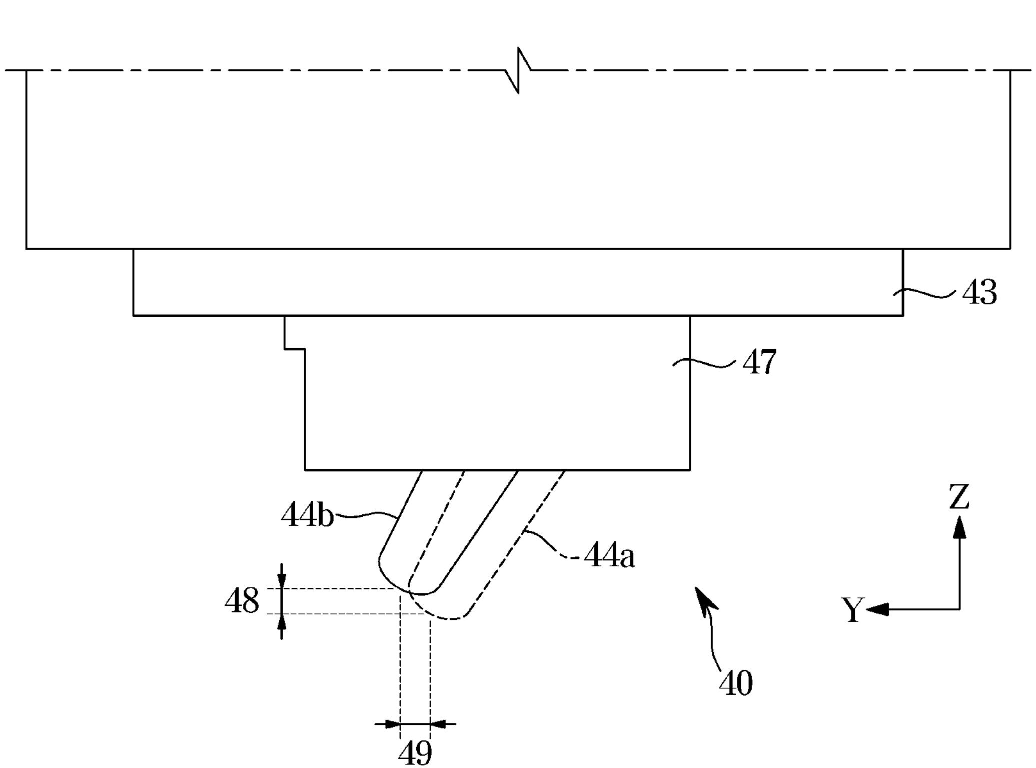
FIG. 14 illustrates a second connector of a display device, according to one or more embodiments.

FIGS. 12 to 14 illustrate the second connector 40 of the display device 1, according to one or more embodiments.

According to one or more embodiments, the second connector 40 of the display device 1 may include electrodes protruding outward and formed of a conductor. This may enable the second connector 40 to transmit and receive the power and/or switching signal from the first connector 30 by making contact with the area of the first connector 30 arranged to face the second connector 40.

The second connector 40 may fall out of contact with the first connector 30 due to movement of the display module 10 in the X-axis, the Y-axis, or the Z-axis according to one or more embodiments. To facilitate physical contact in multiple directions, the second connector 40 may be arranged to face the first connector 30 while having length in the facing direction may be made with an elastic conductor that may be compressed and/or contracted. Hence, the second connector 40 may include an electrode that may be compressed when in contact with the first connector 30 and restored into an original position when the contact is released due to the elasticity.

For example, the second connector 40 may be formed in a Pogo pin or terminal pin structure with conductors to transmit and receive the power signal and/or the switching signal.

Referring to FIG. 12, the second connector 40 may be formed in the Pogo pin structure. Specifically, the second connector 40 may be arranged on the PCB 43 equipped in the display module 10. Hence, the second connector 40 may transmit a received electrical signal (the power signal and/or the switching signal) to the PCB 43.

The second connector 40 may include electrodes 44 each having an end of a round shape to facilitate contact with the first connector 30 from the movement of the side direction +X or −X, guides 46 for guiding the electrodes to prevent movement in the side direction +X or −X, and a housing 47 that encloses and supports the guides 46. Furthermore, the electrodes 44 may each include an elastic member 45 that enables compression and restoration in the vertical direction +Z and −Z. The elastic members 45 may prevent the second connector 40 from being damaged when the electrodes 44 make contact with the first connector 30.

Moreover, the elastic members 45 may be made of, for example, conductors including a conductive material for electrical connection between the electrodes 44 and the PCB 43. There are no limitations on the conductive material, and the elastic member 45 may have a spring-like spiral structure, without being limited thereto.

Referring to (a) of FIG. 13, the second connector for power 41 and second connector for switching signal 42 included in the second connector 40 may have different lengths in the vertical direction +Z and −Z. Specifically, in a case that the display module 10 is coupled in the direction of the Z-axis, length of the second connector for power 41 in the vertical direction +Z and −Z may be longer than the length of the second connector for switching signal 42 to make the second connector for power 41 of the second connector 40 first contact the first connector for power 31. Hence, when the display module 10 is decoupled in the direction of the Z-axis, the contact between the second connector for switching signal 42 and the first connector for switching signal 32 may be released first.

According to one or more embodiments, referring to (b) of FIG. 13, the second connector for power 41 and second connector for switching signal 42 included in the second connector 40 may have different positions in the coupling direction +Y and −Y of the display module 10. Specifically, in a case that the display module 10 is coupled in the direction of the Y-axis, the second connector for power 41 is separated from the second connector for switching signal 42 by a preset distance in the coupling direction −Y, so the first connector for power 31 and the second connector for power 41 may contact first when the display module 10 is coupled.

More specifically, in a case that there is a difference in length between the first and second connectors for switching signal 41 and 42, as shown in (b) of FIG. 13, even when there is no difference in length of the first connector for power 31 and the first connector for switching signal 32 in the coupling and decoupling directions −Y and +Y, the first connector for power 31 and the second connector for power 41 may contact earlier than contact between the second connector for power 41 and the second connector for switching signal 42. Accordingly, in a case that the display module 10 is decoupled, the first connector for switching signal 32 and the second connector for switching signal 42 may be decoupled at a different time earlier than decoupling of the first connector for power 31 and the second connector for power 41.

Referring to FIG. 14, the second connector 40 may be formed in the terminal pin structure. The second connector 40 may be arranged on the PCB 43 equipped in the display module 10. Hence, the second connector 40 may transmit a received electrical signal (the power signal and/or the switching signal) to the PCB 43.

The second connector 40 may include terminal pins 44*a* and 44*b* that are slanted and have curved ends in a round shape to facilitate contact with the first connector 30 while moving in the coupling direction −Y, and a housing 47 that encloses and supports the terminal pins 44*a* and 44*b* that may be compressed and restored to a direction in which the terminal pins 44*a* and 44*b* are moved. The first terminal pin 44*a* may be, for example, an electrode of the second connector for power 41, and the second terminal pin 44*b* may be, for example, an electrode of the second connector for switching signal 42.

According to one or more embodiments (see FIG. 13), the terminal pins 44*a* and 44*b* may be formed to have a difference in length in the vertical direction +Z and −Z as much as a preset length 48, or have a difference in length in the coupling direction +Y and −Y as much as a preset length 49. As shown in FIG. 14, the second connector 40 may be formed to have both differences in length between the two terminal pins 44*a* and 44*b* in the coupling direction +Y and −Y and in the vertical direction +Z and −Z.

Figure 15:
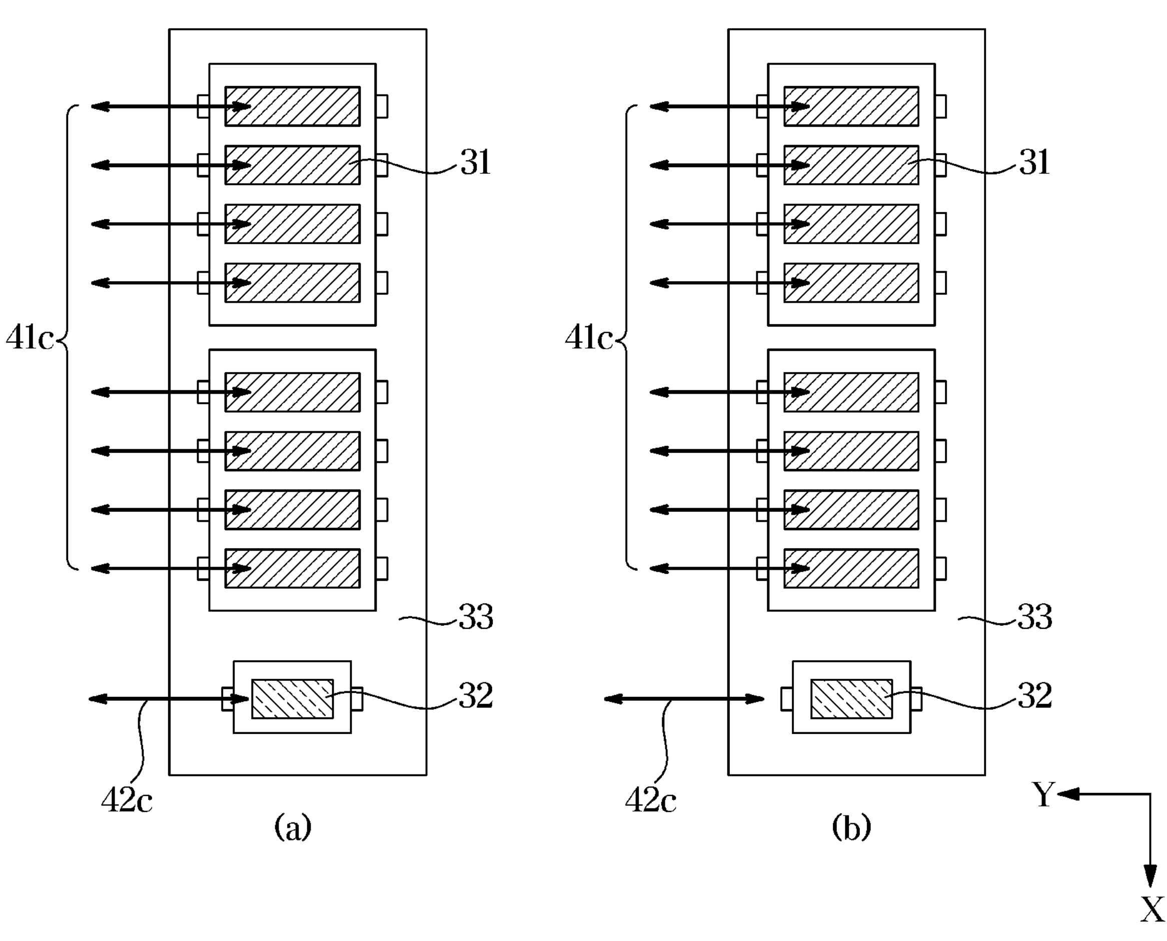
FIG. 15 illustrates a moving path of a second connector of a display device, according to one or more embodiments.

FIG. 15 illustrates movement paths 41*c* and 42*c* of the second connector 40 of the display device 1, according to one or more embodiments.

Referring to (a) of FIG. 15, in a case that the display module 10 is coupled, length of an area of the first connector for switching signal 32 in the coupling direction −Y is smaller than length of an area of the first connector for power 31 by a preset distance, so referring to the movement path 41*c* of the second connector for power 41 and the movement path 42*c* of the second connector for switching signal 42, the contact between the second connector for power 41 and the first connector for power 31 is made at a different time earlier than the contact between the second connector for switching signal 42 and the first connector for switching signal 32. Furthermore, referring to the movement paths 41*c* and 42*c*, in a case that the display module 10 is decoupled, the contact between the second connector for power 41 and the first connector for power 31 is released at a different time later than the contact between the second connector for switching signal 42 and the first connector for switching signal 32.

Referring to (b) of FIG. 15, in a case that the display module 10 is coupled, length of an area of the first connector for switching signal 32 in the coupling direction −Y is smaller than length of an area of the first connector for power 31 by a preset distance, and the second connector for power 41 is separated from the second connector for switching signal 42 by a preset distance in the coupling direction −Y, so it will be understood that contact between the second connector for power 41 and the first connector for power 31 is made at a different time earlier than the contact between the second connector for switching signal 42 and the first connector for switching signal 32.

In a case that both a distance between locations of the second connector for power 41 and the second connector for switching signal 42 and a difference in length in the coupling direction −Y between the first connector for power 31 and the first connector for switching signal 32 are applied, for more higher reliability, a difference in timing between the contact between the first connector and the second connector 31 and 41 and the contact between the first connector and the second connector 32 and 42 may be introduced. Accordingly, it may significantly reduce the risk of arc discharge of the display device 1. However, it is not limited thereto.

At least one or more embodiments of introducing a structural timing difference of contacts and releases of the first connector 30 and the second connector 40 are applied to the display device 1, thereby significantly reducing the risk of arc discharge. The structural timing difference in contacts of the first connector 30 and the second connector 40 was described by using, for example, the structure of the second connector 40 that protrudes outward from the display module 10 and the structure of the first connector 30 having an area, but the opposite case may be applied as well.

Figure 16:
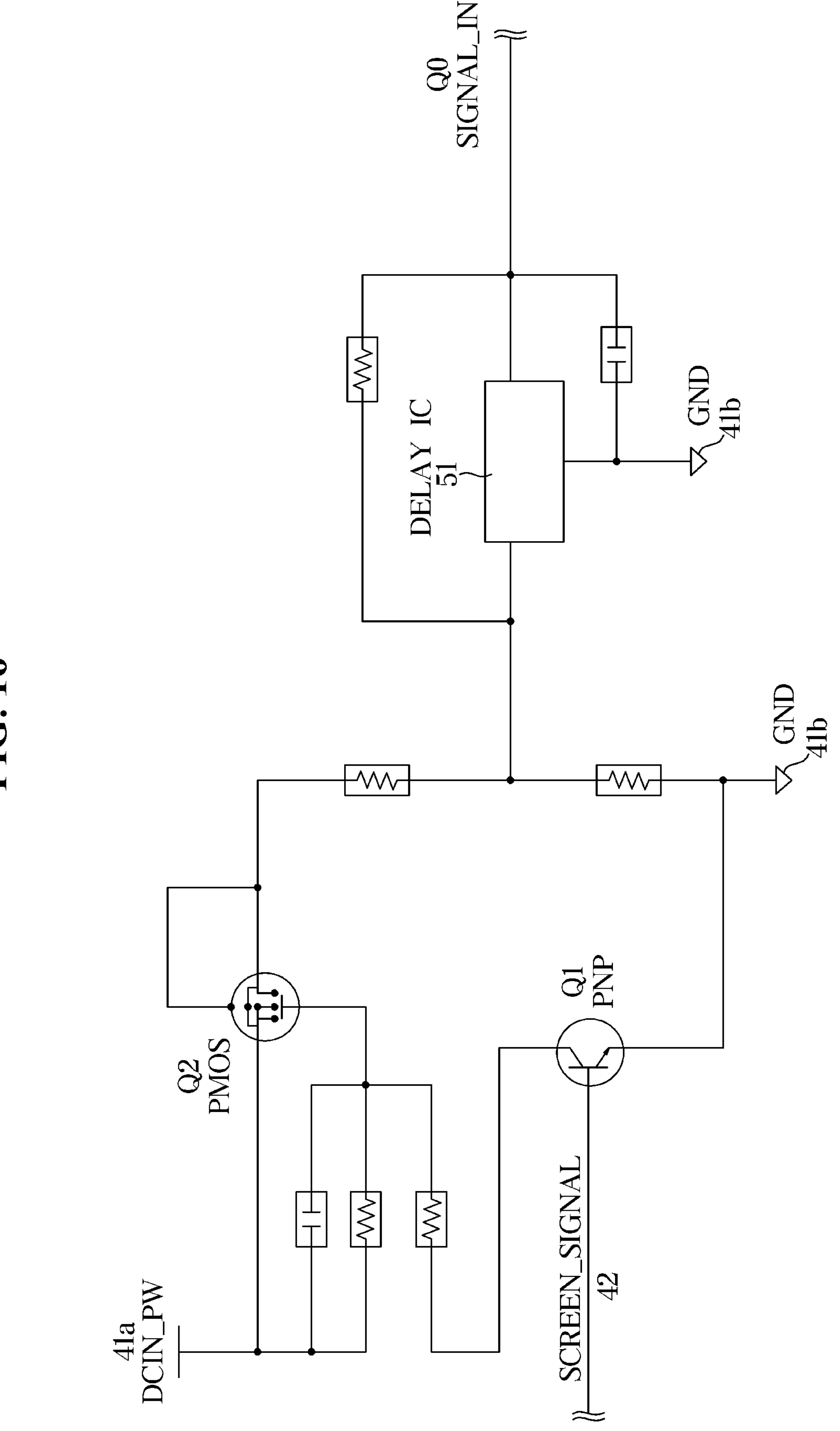
FIG. 16 illustrates a configuration of a switching circuit of a display device, according to one or more embodiments.
Figure 17:
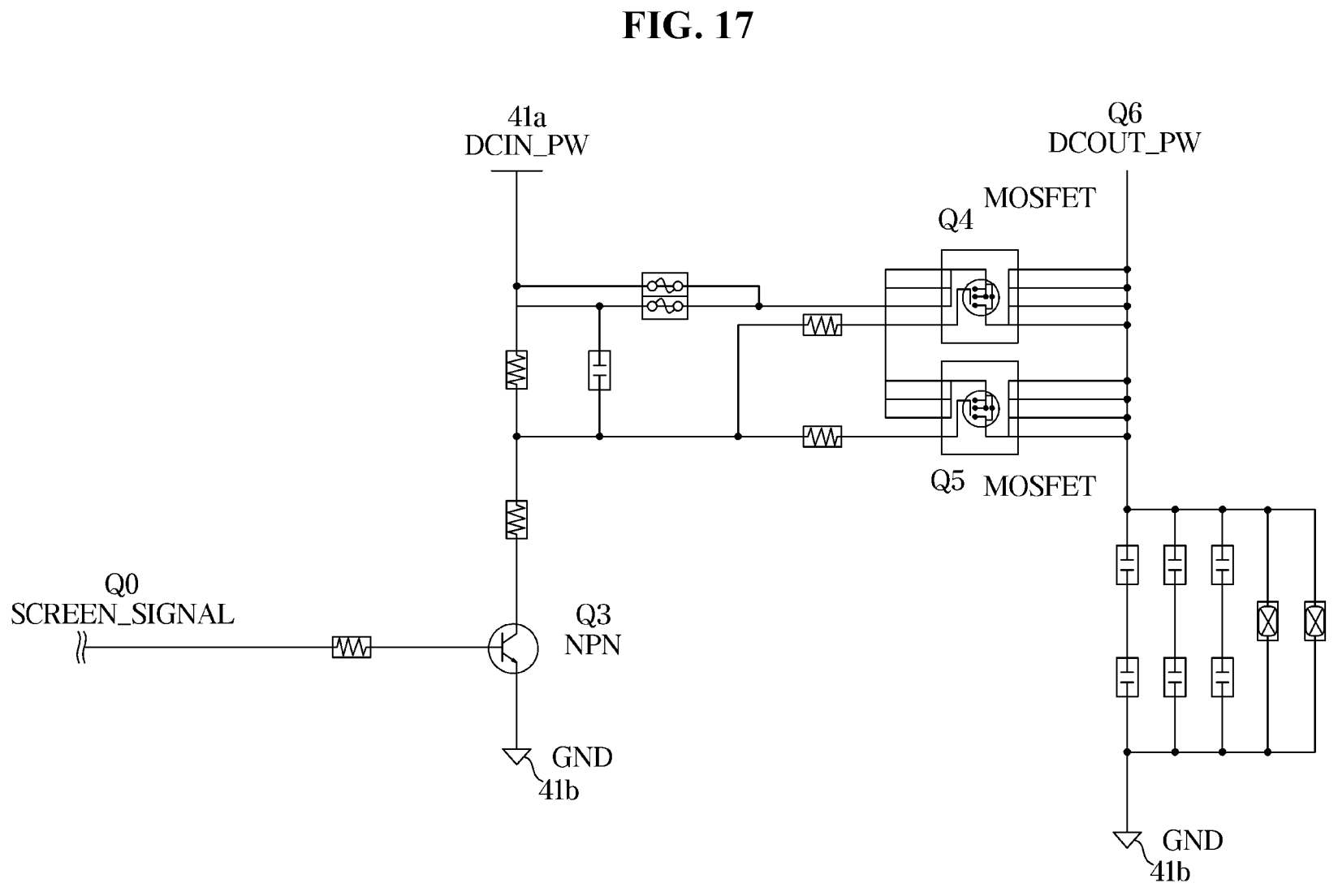

FIGS. 16 and 17 illustrate a configuration of the switching circuit 50 of the display device 1, according to one or more embodiments.

Referring to FIGS. 16 and 17, the switching circuit 50 may include terminals to be electrically connected to the second connector for power 41*a* for receiving the power signal, the second connector for power 41*b* for providing ground, and the second connector for switching signal 42 for transmitting and receiving the switching signal. The second connector for power 41*a* may receive the power signal from the first connector for power 31*a* and output the power signal to the switching circuit 50. Furthermore, the second connector for switching signal 42 may receive the switching signal from the first connector for switching signal 32 and output the switching signal to the switching circuit 50.

The switching circuit 50 may be short-circuited to apply the power signal to the display module 10 in response to the input of the switching signal. Furthermore, the switching circuit 50 may further include a delayer 51 for delaying the switching signal. Accordingly, the display device 1 may delay the input of the switching signal not only by the structural contact but also by the delayer 51. However, it is not limited thereto.

Referring to FIGS. 16 and 17, while the first connector for power 31 and the second connector for power 41 are in contact with each other and the first connector for switching signal 32 and the second connector for switching signal 42 are coupled to each other, when a switching signal is input to a PNP transistor Q1, the switching circuit 50 conducts a P-channel metal oxide semiconductor (PMOS) Q2, enabling the switching signal to be input to the delayer 51. When the switching signal is delayed by the delayer 51 and input to an NPN transistor Q3 via Q0, the NPN transistor Q3 is electrically connected to a first MOSFET Q4 and a second MOSFET Q5, enabling the power signal to be output Q6. The switching circuit 50 may be implemented with various structures and components, without being limited thereto.

Although certain example embodiments are illustrated and described above, the present disclosure is not limited to the example embodiments, various applications may of course be performed by those skilled in the art without deviating from what is claimed in the scope of claims, and such applications should not be understood separately from the technical idea or prospects herein.

What is claimed is:

1. A display device comprising:

a display module on which a second connector is provided;

a chassis assembly configured to support the display module;

a printed circuit board provided in the chassis assembly and configured to drive or control the display module; and a first connector electrically connected to the printed circuit board and arranged to match the second connector, the first connector being configured to transmit and receive electric signals to the display module, wherein the first connector comprises a first power connector for power and a first switching signal connector for switching signal that have areas facing the second connector, wherein each of the first switching signal connector and the first power connector has a length of an area in a direction in which the display module is coupled to the chassis assembly, and the length of the area of the first switching signal connector is less than the length of the area of the first power connector, and wherein in a state in which the display module is coupled to the chassis assembly, the first power connector contacts the second connector before the first switching signal connector contacts the second connector.

2. The display device of claim 1, wherein one of the first connector and the second connector is a female connector and the other one of the first connector and the second connector is a male connector.

3. The display device of claim 1, wherein the first power connector has a length in a direction facing the second connector that is greater than a length in the direction facing the second connector of the first switching signal connector.

4. The display device of claim 1, wherein in a state in which the second connector is provided to face a rear direction of the display module, the areas of the first power connector and the first switching signal connector are determined according to a limit movement amount in a side direction of the display module.

5. The display device of claim 1, wherein in a state in which the second connector is arranged to face a side direction of the display module, a length of the first switching signal connector in a coupling direction of the display module is less than a length of the first power connector in the coupling direction of the display module.

6. The display device of claim 1, wherein the second connector comprises an elastic conductor configured to be compressed in a state in which the second connector contacts the first connector.

7. The display device of claim 6, wherein the second connector comprises a second power connector for power arranged to match the first power connector and a second switching signal connector for switching signal arranged to match the first switching signal connector.

8. The display device of claim 7, wherein each of the second power connector and the second switching signal connector has a length in a direction of compression, and the length in the direction of compression of the second power connector is greater than the length in the direction of compression of the second switching signal connector.

9. The display device of claim 7, wherein the second power connector is spaced apart from the second switching signal connector by a preset distance in a coupling direction of the display module, and wherein in a state in which the display module is coupled to the chassis assembly, the second power connector contacts the first power connector before the second switching signal connector contacts the first switching signal connector.

10. The display device of claim 1, wherein the display module further comprises a circuit configured to output power, which is input from the first power connector, to the display module in in a state in which the second connector contacts the first switching signal connector.

11. The display device of claim 10, wherein the circuit further comprises a delayer configured to delay a signal input from the first switching signal connector, and wherein the circuit is configured to output power, which is input from the first power connector, to the display module based on input of a signal delayed by the delayer.

12. The display device of claim 6, wherein the second connector comprises:

an electrode contacting the first connector;

a conductive elastic member electrically connected to the electrode;

a guide configured to guide a compression direction of the electrode; and a housing enclosing and supporting the guide.

13. A display device comprising:

a plurality of display modules integrally forming a screen; and a chassis assembly supporting the plurality of display modules, wherein each of the plurality of display modules comprises a main body and a second connector arranged in the main body, wherein the chassis assembly comprises:

a printed circuit board configured to drive or control the plurality of display modules; and a first connector electrically connected to the printed circuit board and arranged to match the second connector, the first connector being configured to transmit and receive electric signals to the plurality of display modules, wherein the first connector comprises a first power connector for power and a first switching signal connector for switching signal that are arranged to have areas facing the second connector, and wherein each of the first switching signal connector and the first power connector has a length of an area of a direction in which the plurality of display modules are coupled to the chassis assembly, and the length of the area of the first switching signal connector is less than the length of the area of the first power connector, and wherein in a state in which the plurality of display modules are coupled to the chassis assembly, the first power connector contacts the second connector before the first switching signal connector contacts the second connector.

14. The display device of claim 13, wherein the first power connector has a length in a direction facing the second connector that is greater than a length in the direction facing the second connector of the first switching signal connector.

15. The display device of claim 13, wherein in a state in which the second connector is provided to face a rear direction of the plurality of display modules, the areas of the first power connector and the first switching signal connector are determined according to a limit movement amount in a side direction of the plurality of display modules.

16. The display device of claim 13, wherein in a state in which the second connector is provided to face a side direction of the plurality of display modules, a length of the first switching signal connector in a coupling direction of the plurality of display modules is less than a length of the first power connector in the coupling direction of the plurality of display modules.

17. The display device of claim 13, wherein the second connector comprises an elastic conductor configured to be compressed in a state in which the second connector contacts the first connector.

18. The display device of claim 17, wherein the second connector comprises a second power connector for power arranged to match the first power connector and a second switching signal connector for switching signal arranged to match the first switching signal connector.

19. The display device of claim 18, wherein each of the second power connector and the second switching signal connector has a length in a direction of compression and the length in the direction of compression of the second power connector is greater than the length in the direction of compression of the second switching signal connector.

20. The display device of claim 18, wherein the second power connector is spaced apart from the second switching signal connector by a preset distance in a coupling direction of the plurality of display modules, and wherein in a state in which the plurality of display modules are coupled to the chassis assembly, the second power connector contacts the first power connector before the second switching signal connector contacts the first switching signal connector.

* * * * *